United States Patent
Palaskas et al.

(10) Patent No.: US 6,958,644 B2
(45) Date of Patent: Oct. 25, 2005

(54) ACTIVE FILTER CIRCUIT WITH DYNAMICALLY MODIFIABLE GAIN

(75) Inventors: George Palaskas, Portland, OR (US); Yannis Tsividis, New York, NY (US); Laszlo Toth, Budapest (HU)

(73) Assignee: The Trustees of Columbia University in the City of New York, New York, NY (US)

(*) Notice: Subject to any disclaimer, the term of this patent is extended or adjusted under 35 U.S.C. 154(b) by 98 days.

(21) Appl. No.: 10/450,650
(22) PCT Filed: Jan. 10, 2002
(86) PCT No.: PCT/US02/04669
§ 371 (c)(1), (2), (4) Date: Apr. 9, 2004
(87) PCT Pub. No.: WO02/056470
PCT Pub. Date: Jul. 18, 2002

(65) Prior Publication Data
US 2004/0169551 A1 Sep. 2, 2004

Related U.S. Application Data
(60) Provisional application No. 60/260,722, filed on Jan. 10, 2001, and provisional application No. 60/288,976, filed on May 4, 2001.

(51) Int. Cl.[7] .............................. H03K 5/00; H03F 1/00
(52) U.S. Cl. ......................... 327/553; 330/151; 330/149
(58) Field of Search .......................... 330/52, 136, 149, 330/151; 327/552, 553

(56) References Cited

U.S. PATENT DOCUMENTS

| | | | |
|---|---|---|---|
| 5,724,433 A | 3/1998 | Engebbretson et al. | ..... 381/106 |
| 6,072,885 A | 6/2000 | Stockham, Jr. et al. | ..... 381/321 |
| 6,078,796 A | 6/2000 | Ling | ....................... 455/234.1 |
| 6,359,508 B1 * | 3/2002 | Mucenieks | ................... 330/149 |
| 6,727,751 B2 * | 4/2004 | Yonenaga et al. | .......... 330/151 |

* cited by examiner

Primary Examiner—Dinh T. Le
(74) Attorney, Agent, or Firm—Baker Botts LLP

(57) ABSTRACT

A signal processing system (100) comprises an input terminal (102), and a main path having a main filter input gain unit (126) coupled to said input terminal (102), a main filter (132) and an output gain unit (138). An auxiliary path includes an auxiliary filter input gain unit (106) coupled to the input terminal (102), an auxiliary filter (112) and an auxiliary filter output gain unit (118). An adder (144) is coupled to the output gain units (118, 138) for generating an output signal to an output terminal (148). The gains of the gain units are adjusted by a control unit (18) responsive to a detecting signal from a detector (160).

13 Claims, 18 Drawing Sheets

ACTIVE FILTER CIRCUIT WITH DYNAMICALLY MODIFIABLE GAIN

This application claims priority to U.S. Provisional Application Ser. No. 60/260,722 filed Jan. 10, 2001, and U.S. Provisional Application Ser. No. 60/288,976 filed May 4, 2001, each of which is incorporated by reference herein in its entirety.

BACKGROUND OF THE INVENTION

The present invention relates to signal processors and, more particularly, to signal processors that are dynamically modifiable for optimal performance and reduced power dissipation.

In order to expand the dynamic range of a signal processing system, companding signal processors can be used. A companding signal processor uses an input amplifier to amplify or attenuate a signal before it is provided to the signal processor, and an output amplifier is used to amplify or attenuate the signal provided by the signal processor. A signal processor or signal processing circuit includes an active filter. The gain of the output amplifier is the inverse of the gain of the input amplifier, thus conserving the overall gain of the signal processor. Ideally, the gains of the input amplifier and output amplifier can be varied dynamically. A signal strength detector can be used to measure the strength of the input signal and provide a corresponding gain control signal. See Y. Tsividis, "Externally linear, time-invariant systems and their application to companding signal processors," IEEE Transactions on Circuits and Systems II, Vol. 44, No. 2, February 1997. The gain control signal sets the amplification factors of the input amplifier and the output amplifier. However, this approach has the problem in that because the signal processor has memory, distortion in the output of the signal processor occurs whenever the amplification factors of the input amplifier and the output amplifier are changed.

The analog floating point technique addresses the problem of distortion in the output whenever the amplification factors change. See E. Blumenkrantz, "The analog floating point technique," Proc. IEEE Symposium on Low Power Electronics, pp. 72–73, 1995. This technique avoids distortion by altering the state variables of the signal processor when the amplification factors change. However, implementation of the analog floating point technique is complicated, and is sensitive to parasitics and component mismatch. Accordingly, there is a need for circuits which expand the dynamic range of a signal processor without interrupting the output of the system or causing distortion.

SUMMARY OF THE INVENTION

It is therefore an object of this invention to provide a circuit which has a large dynamic range and which operates in an energy-efficient manner without interrupting the output of the circuit or causing distortion.

In accordance with the present invention, there is provided an active filter system including a system input for receiving a system input signal, a system output for providing a system output signal, a first input gain circuit, a first filter circuit, a first output gain circuit, a second input gain circuit, a second filter circuit, a second output gain circuit and a signal adding circuit. The first input gain circuit having a signal input coupled to the system input for receiving the system input signal, a gain control input and an output for providing a first amplified system input signal, the first input gain circuit being responsive to a first gain control signal received by the gain control input for amplifying the system input signal by a first amplification factor to obtain the first amplified system input signal, and being responsive to a second gain control signal received by the gain control input for amplifying the system input signal by a second amplification factor to obtain the first amplified system input signal. The first filter circuit having an input coupled to the output of the first input gain circuit, and an output, the first filter circuit being responsive to the first amplified system input signal received at its input for providing a first processed signal at its output. The first output gain circuit having a signal input coupled to the output of the first filter circuit for receiving the first processed signal, a gain control input and an output for providing a first amplified processed signal, the first output gain circuit being responsive to the first gain control signal received by its gain control input for amplifying the first processed signal received at its signal input by a third amplification factor to obtain the first amplified processed signal and responsive to a second gain control signal received by its gain control input for amplifying the first processed output signal received at its signal input by a fourth amplification factor to obtain the first amplified processed signal. The second input gain circuit having a signal input coupled to the system input for receiving the system input signal, a gain control input, an output control input, and an output for providing a second amplified system input signal, the second input gain circuit being responsive to the first gain control signal received by its gain control input for amplifying the system input signal by the first amplification factor to obtain the second amplified system input signal and being responsive to the second gain control signal received by its gain control input for amplifying the system input signal by the second amplification factor to obtain the second amplified system input signal, and the second input gain circuit being responsive to a first output control signal received by its output control input for providing the second amplified system input signal to its output and responsive to a second output control signal for causing its output to be an open circuit. The second filter circuit having an input coupled to the output of the second input gain circuit, and an output, the second signal processing circuit being responsive to the second amplified system input signal received by its input for providing a second processed signal at its output. The second output gain circuit having a signal input coupled to the output of the second filter circuit for receiving the second processed signal, a gain control input, a polarity control input, an output control input, and an output for providing one of an auxiliary output signal and ground, the second output gain circuit being responsive to a third gain control signal received by its gain control input for amplifying the second processed signal by a fifth amplification factor to obtain an amplified second processed signal, and being responsive to a fourth gain control signal received by its gain control input for amplifying the second processed signal by a sixth amplification factor to obtain the amplified second processed signal, the second output gain circuit being responsive to a first polarity gain control signal received by its polarity control input for inverting the amplified second processed signal to obtain the auxiliary output signal, and being responsive to a second polarity gain control signal received by its polarity control input for amplifying the amplified second processed signal by a unity gain to obtain the auxiliary output signal, the second output gain circuit being responsive to a first output control signal received by its output control input for connecting its output to ground, and being responsive to a second output control signal received by its output control input for providing the auxiliary output signal at its output. The signal adding circuit having a first input coupled to the output of the first output gain circuit, a second input coupled to the output of the second output gain circuit, and an output coupled to the system output, the signal adding circuit combining the first amplified processed signal provided by the output of the first output gain circuit, and one of the auxiliary output signal and ground provided by the output of the second output gain circuit to provide the system output signal at the output of the signal adding circuit.

According to another embodiment of the invention, there is provided an active filter system including a system input for receiving a system input signal, a system output for providing a system output signal, a first input gain circuit, a first filter circuit, a second input gain circuit, a second filter circuit, a signal adding circuit, a first output gain circuit. The first input gain circuit having a signal input coupled to the system input for receiving the system input signal, a gain control input and an output for providing a first amplified system input signal, the first input gain circuit being responsive to a first gain control signal received by the gain control input for amplifying the system input signal by a first amplification factor to obtain the first amplified system input signal and responsive to a second gain control signal received by the gain control input for amplifying the system input signal by a second amplification factor to obtain the first amplified system input signal. The first filter circuit having an input coupled to the output of the first input gain circuit and an output, the first filter circuit being responsive to a first amplified system input signal received at its input for providing a first processed signal at its output. The second input gain circuit having a signal input coupled to the system input for receiving the system input signal, a gain control input, an output control input and an output for providing a second amplified system input signal, the second input gain circuit being responsive to the first gain control signal received by its gain control input for amplifying the system input signal by the first amplification factor to obtain the second amplified system input signal and responsive to the second gain control signal received by its gain control input for amplifying the system input signal by the second amplification factor to obtain the second amplified system input signal, the second input gain circuit being responsive to a first output control signal received by its output control input for providing the second amplified system input signal to its output and responsive to a second output control signal for causing its output to be an open circuit. The second filter circuit having a signal input coupled to the output of the second input gain circuit, a gain control input and an output for providing a second amplified processed signal, the second filter circuit being responsive to the second amplified system input signal received by its input for providing a second processed signal, and being responsive to a third gain control signal received by its gain control input for amplifying the second processed signal by a fifth amplification factor to obtain the second amplified processed signal and being responsive to a fourth gain control signal received by its gain control input for amplifying the second processed signal by a sixth amplification factor to obtain the second amplified processed signal. The signal adding circuit having a first input coupled to the output of the first filter circuit, a second input coupled to the output of the second filter circuit and an output for providing a combined processed signal, the signal adding circuit combining the first processed output signal provided by the output of the first filter circuit and the second amplified processed signal provided by the output of the second filter circuit to provide the combined processed signal. The first output gain circuit having a signal input coupled to the output of the signal adding circuit, a gain control input and an output coupled to the system output, the first output gain circuit being responsive to the first gain control signal received by its gain control input for amplifying the combined processed signal received at its signal input by a third amplification factor to obtain the system output signal at its output and being responsive to a second gain control signal received by its gain control input for amplifying the combined processed signal received at its signal input by a fourth amplification factor to obtain the system output signal at its output.

According to another embodiment of the invention, there is provided a filter system including a system input for receiving a system input signal, a system output for providing a system output signal, a first input gain circuit, a first filter circuit, a second input gain circuit, a second filter circuit, a signal adding circuit, a first output gain circuit, and a signal switching circuit. The first input gain circuit having a signal input coupled to the system input for receiving the system input signal, a gain control input and an output for providing a first amplified system input signal, the first input gain circuit being responsive to a first gain control signal received by the gain control input for amplifying the system input signal by a first amplification factor to obtain the first amplified system input signal and responsive to a second gain control signal received by the gain control input for amplifying the system input signal by a second amplification factor to obtain the first amplified system input signal. The first filter circuit having an input coupled to the output of the first input gain circuit, a first output for providing a first processed signal, and a second output for providing a buffered first processed signal, the first filter circuit being responsive to a first amplified system input signal received at its input for providing the first processed signal at its first output, and for providing the buffered first processed signal at its second output. The second input gain circuit having a signal input coupled to the system input for receiving the system input signal, a gain control input, an output control input and an output for producing a second amplified system input signal, the second input gain circuit being responsive to the first gain control signal received by its gain control input for amplifying the system input signal by the first amplification factor to obtain the second amplified system input signal and being responsive to the second gain control signal received by its gain control input for amplifying the system input signal by the second amplification factor to obtain the second amplified system input signal, and the second input gain circuit being responsive to a first output control signal received by its output control input for providing the second amplified system input signal to its output and being responsive to a second output control signal received by its output control input for causing its output to be an open circuit. The second filter circuit having a signal input coupled to the output of the second input gain circuit, a gain control input and an output for providing a second amplified processed signal, the second filter circuit being responsive to the second amplified system input signal received by its input for providing a second processed signal, and being responsive to a third gain control signal received by its gain control input for amplifying the second processed signal by a fifth amplification factor to obtain the second amplified processed output signal and being responsive to a fourth gain control signal received by its gain control input for amplifying the second processed signal by a sixth amplification factor to obtain the second amplified processed output signal. The signal adding circuit having a first input coupled to the first output of the first filter circuit, a second input coupled to the output of the second filter circuit and an output for providing a combined processed signal, the signal adding circuit combining the first processed output signal provided by the output of the first filter circuit and the second amplified processed signal provided by the output of the second filter circuit to provide the combined processed signal. The first output gain circuit having a signal input coupled to the output of the signal adding circuit, a gain control input and an output for providing an amplified combined processed signal, the first output gain circuit being responsive to the first gain control signal received by its gain control input for amplifying the combined processed signal received at its signal input by a third amplification factor to obtain the amplified combined processed signal and being responsive to a second gain control signal received by its gain control input for amplifying the combined processed signal received at its signal input by a fourth amplification factor to obtain the amplified combined processed signal. The signal switching circuit having a first signal input coupled to the output of the first output gain circuit, a second signal input coupled to the second output of the first filter circuit, a switch control input and an output coupled to the system output, the signal switching circuit being responsive to receiving a first switching signal at the switch control input for providing the amplified combined processed signal received at the first signal input to the output, and being responsive to receiving a second switching signal at the switch control input for providing the buffered first processed output signal received at the second signal input to the output.

BRIEF DESCRIPTION OF THE DRAWINGS

Further objects, features, and advantages of the invention will become apparent from the following detailed description taken in conjunction with the accompanying figures showing illustrative embodiments of the invention, in which.

Figure 1:
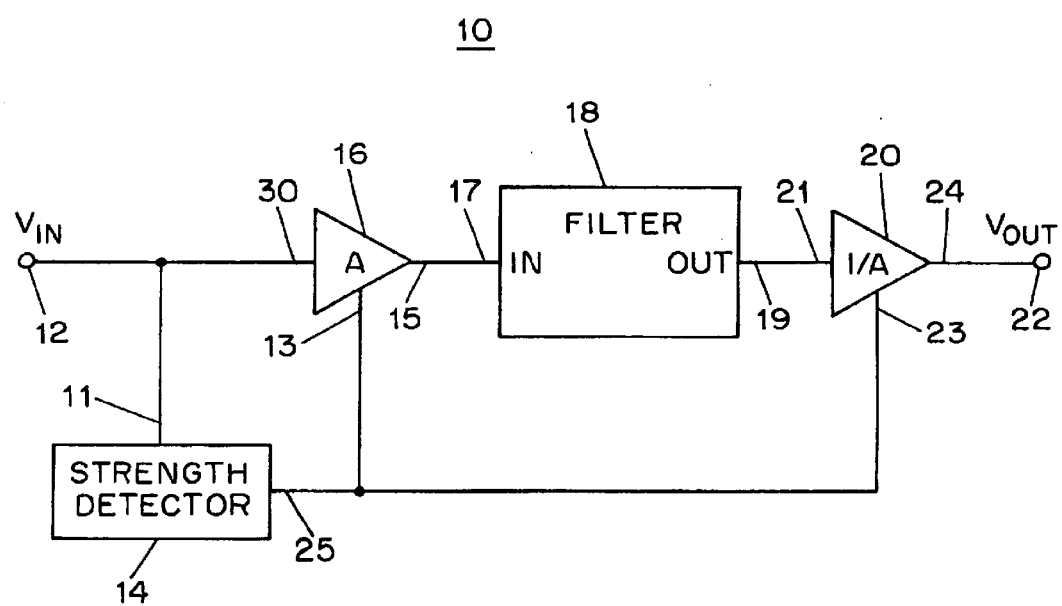
FIG. 1 is a block diagram illustrating a prior art signal processing system.

Throughout the figures, unless otherwise stated, the same reference numerals and characters are used to denote like features, elements, components, or portions of the illustrated embodiments. Moreover, while the subject invention will now be described in detail with reference to the figures, and in connection with the illustrative embodiments, various changes and modifications to the described embodiments will be apparent to those skilled in the art without departing from the true scope and spirit of the subject invention as defined by the appended claims.

DETAILED DESCRIPTION OF THE INVENTION

FIG. 1 illustrates an example of a prior art signal processing system 10. The signal processing system 10 is a companding filter. A companding filter amplifies or attenuates an input signal that is applied to a filter circuit, and attenuates or amplifies the output signal from the circuit. The prior art companding filter 10 includes an input 12, a signal strength detector 14, an input variable gain amplifier 16, a main filter 18, an output variable gain amplifier 20, and an output 22.

The input 12 of the signal processing system 10 is coupled to input 11 of the signal strength detector 14 and an input 30 of an input variable gain amplifier 16. The input variable gain amplifier 16 amplifies or attenuates the signal received by the input 30 depending on a gain control input signal received at a gain control input 13 of the input variable gain amplifier 16 and outputs the resultant signal at its output 15. The output 15 of the input variable gain amplifier 16 is coupled to input 17 of a main filter 18. The main filter 18 processes the signal received at its input 17 and produces a processed output signal at its output 19. The output 19 of the main filter 18 is coupled to input 21 of an output variable gain amplifier 20. The output variable gain amplifier 20 amplifies or attenuates the signal received at its input 21 depending on a gain control signal received at a gain control input 23 of the output variable gain amplifier 20 and outputs the resultant signal at its output 24. The gain of the output variable gain amplifier 20 is the inverse of the gain of the input variable gain amplifier 16. The output 24 of the output variable gain amplifier 20 is connected to the output 22 of the signal processing system 10.

The signal strength detector 14 measures the strength (e.g., the voltage envelope) of the signal applied to the input 11 of the signal strength detector 14 and outputs a gain control signal at its output 25, which is connected to the gain control inputs 13 and 23 of the input variable gain amplifier 16 and the output variable gain amplifier 20, respectively. Depending on the strength of the signal at the input 11 of the signal strength detector 14, different gain control signals are provided at the output 25 of the signal strength detector 14. If the signal applied to the input 11 of the signal strength detector 14 is small, the gain control signal causes the input variable gain amplifier 16 to have a relatively high gain, thereby causing the signal applied to the input 12 of the signal processing system 10 to be amplified before it is applied to the main filter 18, such that the signal is large compared to the filter noise, i.e. the noise generated by the filter. If the signal applied to the input 11 of the signal strength detector 14 is large, the gain control signal causes the input variable gain amplifier 16 to have a relatively low gain, thereby causing the signal applied to the input 12 of the signal processing system 10 to be slightly amplified or even attenuated before it is applied to the main filter 18 to avoid saturating the main filter 18.

Figure 2:
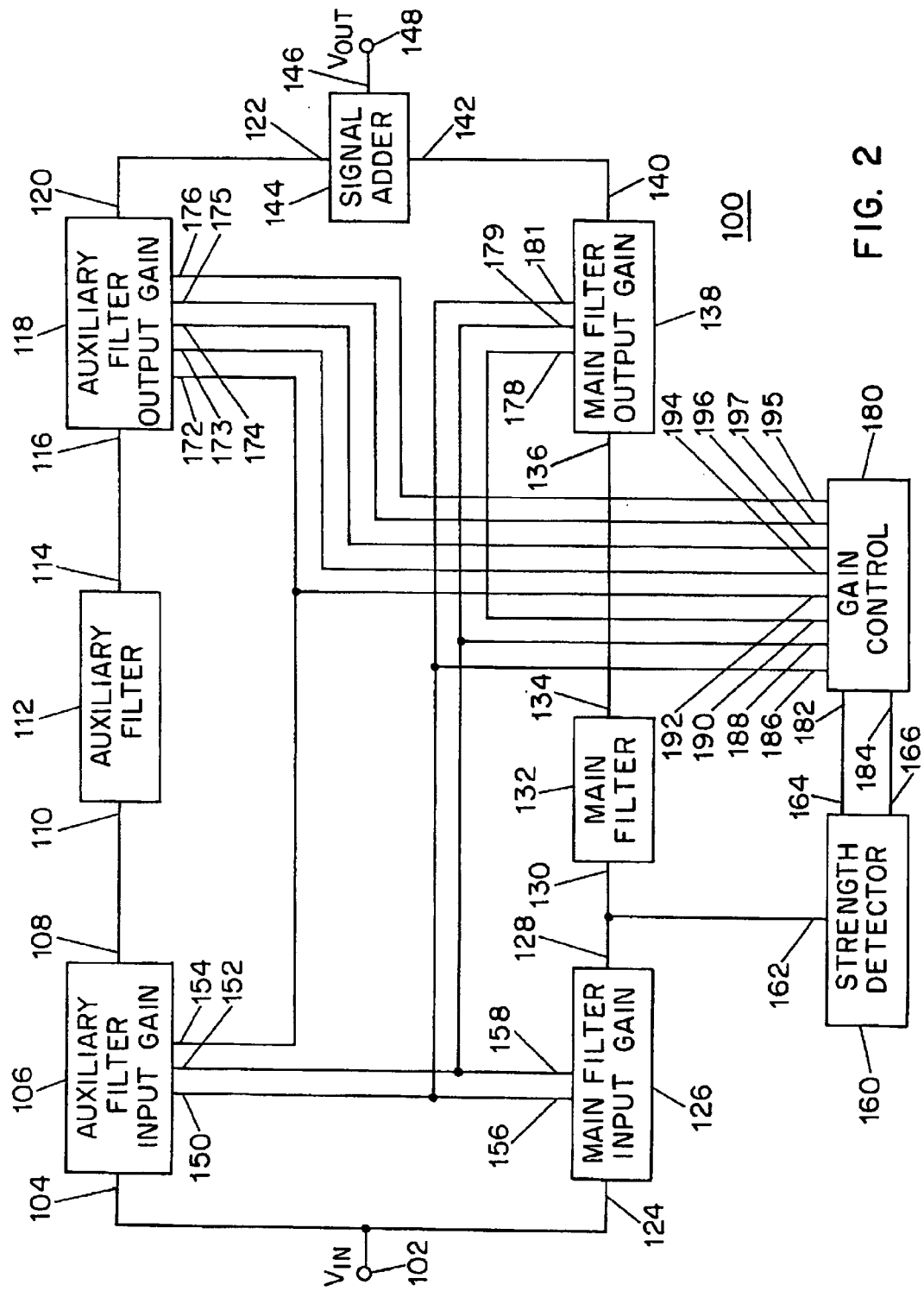
FIG. 2 is a block diagram illustrating a signal processing system in accordance with the present invention.

FIG. 2 illustrates a signal processing system 100. The signal processing system 100 includes a system input 102, a main filter input gain unit 126, a main filter 132, a main filter output gain unit 138, an auxiliary filter input gain unit 106, an auxiliary filter 112, an auxiliary filter output gain unit 118, a signal adder 144, a system output 148, a strength detector 160, and a gain control unit 180. The signal processing system 100 generates a processed signal provided to the system output 148 with a strong in channel component well above the filter noise, which is not disturbed when internal states of the signal processing system 100 are changed. The signal processing system 100 accomplishes this by combining a signal processed by the auxiliary filter output gain unit 118 and a signal processed by the main filter output gain unit 138 whenever there is a change in an amplification factor of the main filter input gain unit 126 and an amplification factor of the main filter output gain unit 138. The signal processed by the auxiliary filter output gain unit 118 is combined with the signal processed by the main filter output gain unit 138 for a period of time at least as long as the amount of time it takes for transients in the signal processed by the main filter output gain unit 138 to die out. The transients in the signal processed by the auxiliary filter output gain unit 118 offset the transients in the signal processed by the main filter output gain unit 138. Therefore by combining the signal produced by the auxiliary filter output gain unit 118 with the signal produced by the main filter output gain unit 138, transients in the signal at the system output 148 of the signal processing system 100 are avoided when the amplification factor of the main filter input gain unit 126 and the amplification factor of the main filter output gain unit 138 are changed.

A signal received at system input 102 is applied to an input 124 of the main filter input gain unit 126 and an input 104 of the auxiliary filter input gain unit 106. The main filter input gain unit 126 amplifies the signal received at its input 124 as controlled by the signals received at its gain control inputs 156, 158. The main filter input gain unit 126 amplifies the signal received at its input 124 by one of three amplification factors. If the signal received at the input 158 represents a logical zero and the signal received at the input 156 represents a logical one, the main filter input gain unit 126 amplifies the signal received at the input 124 by a relatively large factor, here a factor of ten, and produces the amplified signal at its output 128. If the signal received at the input 158 represents a logical zero and the signal received at the input 156 represents a logical zero, the main filter input gain unit 126 amplifies the signal received at the input 124 by a relatively moderate factor, here a factor of one, and produces the amplified signal at its output 128. If the signal received at the input 158 represents a logical one and the signal received at the input 156 represents a logical zero, the main filter input gain unit 126 amplifies the signal received at the input 124 by a relatively small factor, here a factor of one tenth, and produces the amplified signal at its output 128. The output 128 of the main filter input gain unit 126 is coupled to an input 130 of the main filter 132 and an input 162 of the strength detector 160.

The main filter 132 processes the signal received at its input 130, which typically includes an in-band component and an out-band component, and outputs a processed signal at its output 134. Preferably, the main filter 132 has enough linear range to accommodate the in-band component and the out-band component of the signal without saturating. The output 134 of the main filter 132 is coupled to input 136 of the main filter output gain unit 138.

A signal received at an input 136 of the main filter output gain unit 138 is amplified under the control of the signals received at its gain control inputs 178, 179, 181. The main filter output gain unit 138 amplifies the signal received at its input 136 by one of three amplification factors. If the signal received at the input 178 represents a logical zero, the signal received at the input 179 represents a logical zero and the signal received at the input 181 represents a logical one, the main filter output gain unit 138 amplifies the signal received at the input 136 by a relatively small factor, here a factor of one tenth, and produces the amplified signal at its output 140. If the signal received at the input 178 represents a logical one, the signal received at the input 179 represents a logical zero, and the signal received at the input 181 represents a logical zero, the main filter input gain unit 138 amplifies the signal received at the input 136 by a relatively moderate factor, here a factor of one, and produces the amplified signal at its output 140. If the signal received at the input 178 represents a logical zero, the signal received at the input 179 represents a logical one, and the signal received at the input 181 represents a logical zero, the main filter input gain unit 138 amplifies the signal received at the input 136 by a relatively large factor, here a factor of ten, and produces the amplified signal at its output 140. The output 140 of the main filter output gain unit 138 is coupled to an input 142 of the signal adder 144.

The auxiliary filter input gain unit 106 amplifies the signal received at its input 104 under the control of the signals received at its gain control inputs 150, 152, 154. The auxiliary filter input gain unit 106 amplifies the signal received at its input 104 by one of three amplification factors, and produces the amplified signal at its output 108. If the signal received at the input 154 represents a logical zero, the output 108 of the auxiliary filter input gain unit 106 provides an open circuit and the output 108 of the auxiliary filter input gain unit 106 is allowed to float. If the signal received at the input 154 represents a logical one, the signal received at the input 158 represents a logical zero and the signal received at the input 156 represents a logical one, the auxiliary filter input gain unit 106 amplifies the signal received at the input 104 by a relatively large factor, here a factor of ten, and produces the amplified signal at its output 108. If the signal received at the input 154 represents logical one, the signal received at the input 158 represents a logical zero and the signal received at the input 156 represents a logical zero, the auxiliary filter input gain unit 106 amplifies the signal received at its input 104 by a relatively moderate factor, here a factor of one, and produces the amplified signal at the output 108. If the signal received at the input 154 represents a logical one, the signal received at the input 158 represents a logical one and the signal received at the input 156 is a logical zero, the auxiliary filter input gain unit 106 amplifies the signal received at the input 104 by a relatively small factor, here a factor of one tenth, and produces the amplified processed signal at its output 108. The output 108 of the auxiliary filter input gain unit 106 is coupled to an input 110 of the auxiliary filter 112.

The auxiliary filter 112 processes the signal received at its input 110, which typically includes an in-band component and an out-band component, and outputs a processed signal at its output 114. Preferably, the auxiliary filter 112 has enough linear range to accommodate the in-band component and the out-band component of the signal without saturating. The output 114 of the auxiliary filter 112 is coupled to input 116 of the auxiliary filter output gain unit 118.

A signal received at an input 116 of the auxiliary filter output gain unit 118 is amplified under the control of signals received at gain control inputs 172, 173, 174, 175, 176. The auxiliary filter output gain unit 118 amplifies the signal received at its input 116 by one of three amplification factors, and provides the amplified signal to an output 120. If the signal received at the input 172 represents a logical one, the output 120 of the auxiliary filter output gain unit 106 is connected to ground. If the signal received at the input 172 represents a logical zero, the signal received at the input 173 represents a logical one, the signal received at the input 174 represents a logical zero, the signal received at the input 175 represents a logical zero and the signal received at the input 176 represents a logical one, the auxiliary filter input gain unit 118 amplifies the signal received at the input 116 by a relatively large positive amplification factor, here a factor of nine, and produces the amplified signal at its output 120. If the signal received at the input 172 represents a logical zero, the signal received at the input 173 represents a logical one, the signal received at the input 174 represents a logical zero, the signal received at the input 175 represents a logical one and the signal received at the input 176 represents a logical zero, the auxiliary filter input gain unit 118 amplifies the signal received at the input 116 by a relatively small positive amplification factor, here a factor of nine tenths, and produces the amplified signal at its output 120. If the signal received at the input 172 represents a logical zero, the signal received at the input 173 represents a logical zero, the signal received at the input 174 represents a logical one, the signal received at the input 175 represents a logical one and the signal received at the input 176 represents a logical zero, the auxiliary filter input gain unit 118 amplifies the signal received at the input 116 by a relatively large negative amplification factor, here a factor of minus nine tenths, and produces the amplified signal at its output 120. If the signal received at the input 172 represents a logical zero, the signal received at the input 173 represents a logical zero, the signal received at the input 174 represents a logical one, the signal received at the input 175 represents a logical zero and the signal received at the input 176 represents a logical one, the auxiliary filter input gain unit 118 amplifies the signal received at the input 116 by a relatively small negative factor, here a factor of minus nine, and produces the amplified signal at its output 120. The output 120 of the auxiliary filter output gain unit 118 is coupled to an input 122 of the signal adder 144.

The strength detector 160 measures the strength (e.g., the voltage envelope) of the signal applied to its input 162 and produces an up control signal at its output 166 and a down control signal at its output 164. Depending on the strength of the signal at its input 162, the strength detector 160 produces different signals at its two outputs 166, 164. If the signal applied to the input 162 of the strength detector 160 is below the noise floor threshold level of the main filter 132, which indicates that the amplification factor of the main filter input gain unit 126 should be increased, the strength detector 160 produces a logical one level signal on its output 166 and a logical zero level signal on its output 164. If the signal applied to the input 162 of the strength detector 160 is above the saturation threshold level of the main filter 132, which indicate that the amplification factor of the main filter input gain unit 126 should be decreased, the strength detector 160 produces a logical zero level signal on its output 166 and a logical one level signal on its output 164. If the signal applied to the input 162 of the strength detector 160 is above the noise floor threshold level and below the saturation threshold level of the main filter 132, which indicates that the amplification factor of the main filter input gain unit 126 should remain unchanged, the strength detector 160 produces a logical zero level signal on its output 166 and a logical zero level signal on its output 164. The outputs 166 and 164 are coupled to inputs 184 and 182, respectively, of the gain control unit 180.

The gain control unit 180, responsive to signals received at its inputs 182, 184, provides signals at its outputs 186, 188, 190, 192, 194, 195, 196, 197 to control the respective amplification factors of the main filter input gain unit 126, the main filter output gain unit 138, the auxiliary filter input gain unit 106 and the auxiliary filter output gain unit 118, as well as to selectively connect and disconnect the input 104 of the auxiliary filter input gain unit 106 to and from the system input 102, and to selectively connect and disconnect the output 120 of the auxiliary filter input gain unit 118 to and from the input 122 of the signal adder 144. The outputs 186 and 188 of the gain control unit 180 are connected to the inputs 156 and 158, respectively, of the main filter input gain unit 126. The outputs 186, 188 and 192, are connected to the inputs 150, 152 and 154, respectively, of the auxiliary filter input gain unit 106. The outputs 186, 188 and 190 are connected to the inputs 181, 179 and 178, respectively, of the main filter output gain unit 138. The outputs 192, 194, 196, 197 and 195 are connected to the inputs 172, 173, 174, 175 and 176, respectively, of the auxiliary filter output gain 118.

The gain control unit 180 provides signals to the main filter input gain unit 126, the main filter output gain unit 138, the auxiliary filter input gain unit 106 and the auxiliary filter output gain unit 118 that allow their respective amplification factors to vary without causing transients to appear at the output 148 of the signal processing system 100. The gain control unit 180 begins the process of changing the amplification factors of the main filter input gain unit 126 and the main filter output gain unit 138 by providing the main filter input gain unit 126, the main filter output gain unit 138, the auxiliary filter input gain unit 106 and the auxiliary filter output gain unit 118 with the appropriate signals to change their respective amplification factors to desired values. At the same time, the gain control unit 180 provides an appropriate signal to the auxiliary filter input gain unit 106 to cause its input 104 to disconnect from the system input 102, and provides an appropriate signal to the auxiliary filter output gain unit 118 to connect its output 120 to the input 122 of the signal adder 144. The gain control unit 180 keeps the input 104 of the auxiliary filter input gain 106 disconnected from the system input 102 and keeps the output 120 of the auxiliary filter output gain unit 118 connected to the input 122 of the signal adder 144 for a period of time at least equal to the amount of time it takes for transients in the signal produced by the main filter output gain unit 138 caused by the change in its amplification factor to die out. Once that period of time has lapsed, the gain control unit 180 provides an appropriate signal to the auxiliary filter input gain 106 to cause its input 104 to connect to the system input 102, and provides an appropriate signal to the auxiliary filter output gain unit 118 to cause its output 120 to disconnect from the input 122 of the signal adder 144

The signal adder 144 combines the signals received at its inputs 122, 142 in the current domain and provides the combined signal at its output 146. The output 146 of the signal adder 144 is coupled to the output 148 of the signal processing system 100.

Figure 3:
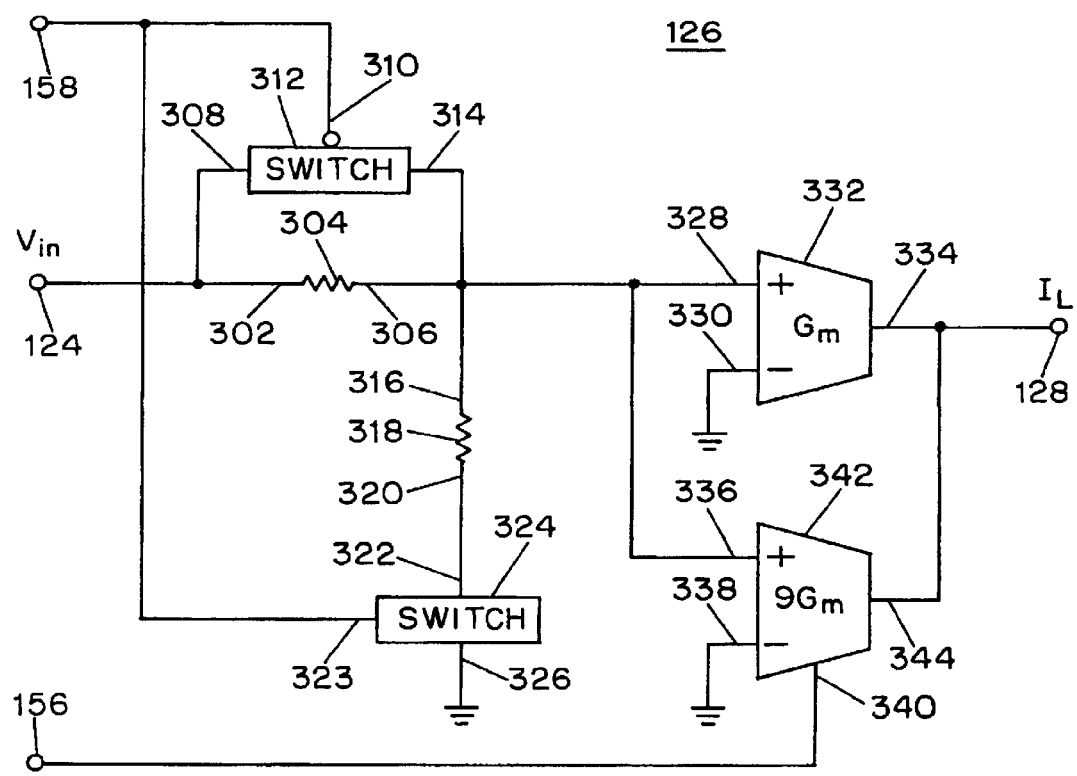
FIG. 3 is a circuit diagram illustrating a main filter input gain unit in accordance with the present invention.

FIG. 3 illustrates an exemplary embodiment of the main filter input gain unit 126. The main filter input gain unit 126 amplifies the signal received at its input 124 by one of three amplification factors as controlled the gain control signals received by the inputs 156, 158. The main filter input gain unit 126 includes a first switch 312, a second switch 324, a first resistor 304, a second resistor 318, a transconductor 332 and an on/off transconductor 342. The first switch 312 and the second switch 324 may each be implemented as a CMOS transmission gate, in which an NMOS transistor and a PMOS transistor are connected in parallel with each other, the gate of the PMOS transistor is connected to the output of an inverter, the input of the inverter and the gate of the NMOS transistor are connected to each other and serve as the switch control terminal, and the source and drain of each transistor serve as the switch terminals. When a CMOS transmission gate is closed, the NMOS transistor and the PMOS transistor are active, such that a signal received on one terminal of the CMOS transmission gate is conveyed to the other terminal of the CMOS transmission gate. When a CMOS transmission gate is open, the NMOS transistor and the PMOS transistor are not active, such that a signal received on one terminal of the CMOS transmission gate is not conveyed to the other terminal of the CMOS transmission gate.

Figure 14:
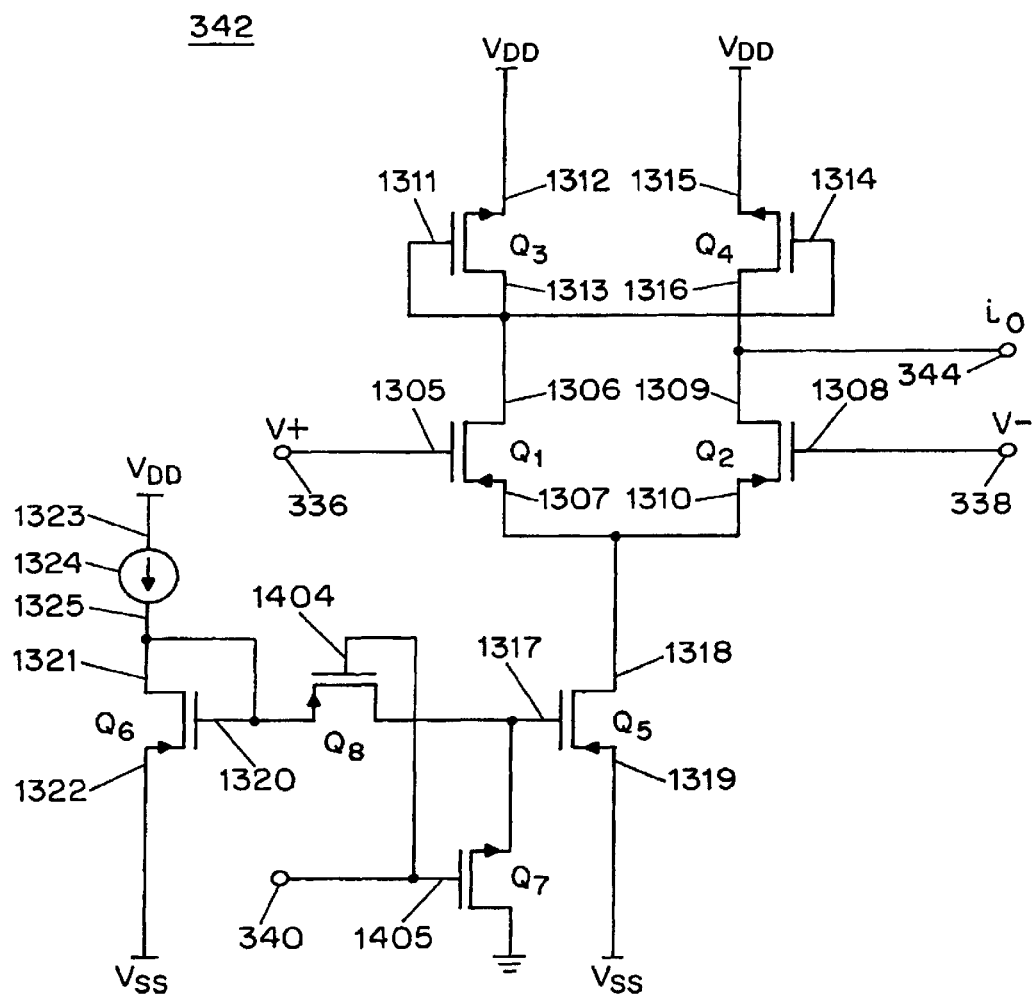
FIG. 14 is a circuit diagram illustrating an on/off transconductor in accordance with the present invention.

A signal received at gain control input 158 of the main filter input gain unit 126 is applied to an inverted switch control terminal 310 of the first switch 312 and one terminal 323 of the second switch 324; a signal received at the input 124 is applied to one terminal 302 of the first resistor 304 and terminal 308 of the first switch 312; and a signal received at gain control input 156 is applied to an on/off input 340 of the on/off transconductor 342, which is described in more detail in relation to FIG. 14. The first switch 312 closes to connect its terminal 308 to its other terminal 314 if the signal received at the inverted switch control terminal 310 is at a logical zero voltage level. If the signal at the inverted switch control terminal 310 is at a logical one voltage level, the first switch 312 opens to disconnect its terminal 308 from its other terminal 314 resulting in an open circuit between terminals 308 and 314. The first resistor 304 is connected between terminal 308 and terminal 314 of the first switch 312. The first resistor 304 may have a resistance of 90 kΩ. The terminal 314 of the first switch 312 and the other terminal 306 of the first resistor 304 are connected to one terminal 316 of the second resistor 318, a positive input 328 of the transconductor 332, and a positive input 336 of the on/off transconductor 342.

The other terminal 320 of the second resistor 318 is coupled to terminal 322 of the second switch 324. The second resistor 318 may have a resistance of 10 kΩ. Terminal 326 of the second switch 324 is connected to ground. The second switch 324 closes by connecting its terminal 322 to its other terminal 326 if the signal received at the switch control terminal 323 is at a logical one voltage level. If the signal at the switch control terminal 323 is at a logical zero voltage level, the second switch 324 opens by disconnecting its terminal 322 from its other terminal 326 resulting in an open circuit. The first switch 312 and the first resistor 304 form one half of a voltage divider, while the second switch 324 and the second resistor 318 form the other half of the voltage divider for the signal received at the input 124. The voltage divider causes the main amplifier gain unit to have a relatively small amplification factor when the signal applied to the gain control input 158 is at a logical or voltage level and the signal applied to the gain control input 156 is at a logical zero voltage level. A main filter input gain unit 126 having a relatively small amplification factor causes the signal process system to be effective for processing relatively large input signals.

The transconductor 332 operates on the difference between the signal received at its positive input 328 and the signal received at its negative input 330, which is connected to ground, and provides a signal at its output 334. The signal at the output 334 of the transconductor 332 is equal to the difference in the signal received by the positive input 328 of the transconductor 332 and the signal received by its negative input 330 scaled by a transconductance $G_m$ of the transconductor 332. The output 334 of the transconductor 332 is coupled to the output 344 of the on/off transconductor 342, and the output 128 of the main filter input gain unit 126. When the first switch 312 is closed (as a result of a logical one voltage level signal applied to its switch control terminal 310), the switch 324 is open (as a result of a large logical zero voltage level signal applied to its switch control terminal 323), and the on/off transconductor 342 is off (as a result of a logical zero voltage level signal received at its control input 340), the main filter input gain unit 126 has a relatively moderate amplification factor, and therefore the signal processing system 100 is effective for processing relatively moderate sized input signals.

If a logical one level voltage signal is received at the control terminal 340 of the on/off transconductor 342, the on/off transconductor 342 operates on the difference between the signal received at its positive input 336 and the signal received at its negative input 338, which is connected to ground, and provides a signal at its output 344. If the signal at its control input terminal 340 is at a logical zero voltage level, the on/off transconductor 342 acts as an open circuit between its input 336 and its output 344. If the signal at the control input terminal 340 is at a logical one voltage level, the signal at the output 344 of the on/off transconductor 342 is equal to the difference in the signal received by its positive input 336 and the signal received by its negative input 338 scaled by a transconductance 9 $G_m$ of the on/off transconductor 342. The output 344 of the on/off transconductor 342 is coupled to the output 334 of the transconductor 332 and to the output 128 of the main filter input gain unit 126. When the on/off transconductor 342 is on, i.e. when the signal at its control input 340 is at a logical one voltage level, the voltage output of the on/off transconductor 342 combines with the voltage output of the transconductor 332 causing the main filter input gain unit 129 to have a relatively large amplification factor, which in turn causes the signal processing system 129 to be effective for processing relatively small input signals.

Figure 4:
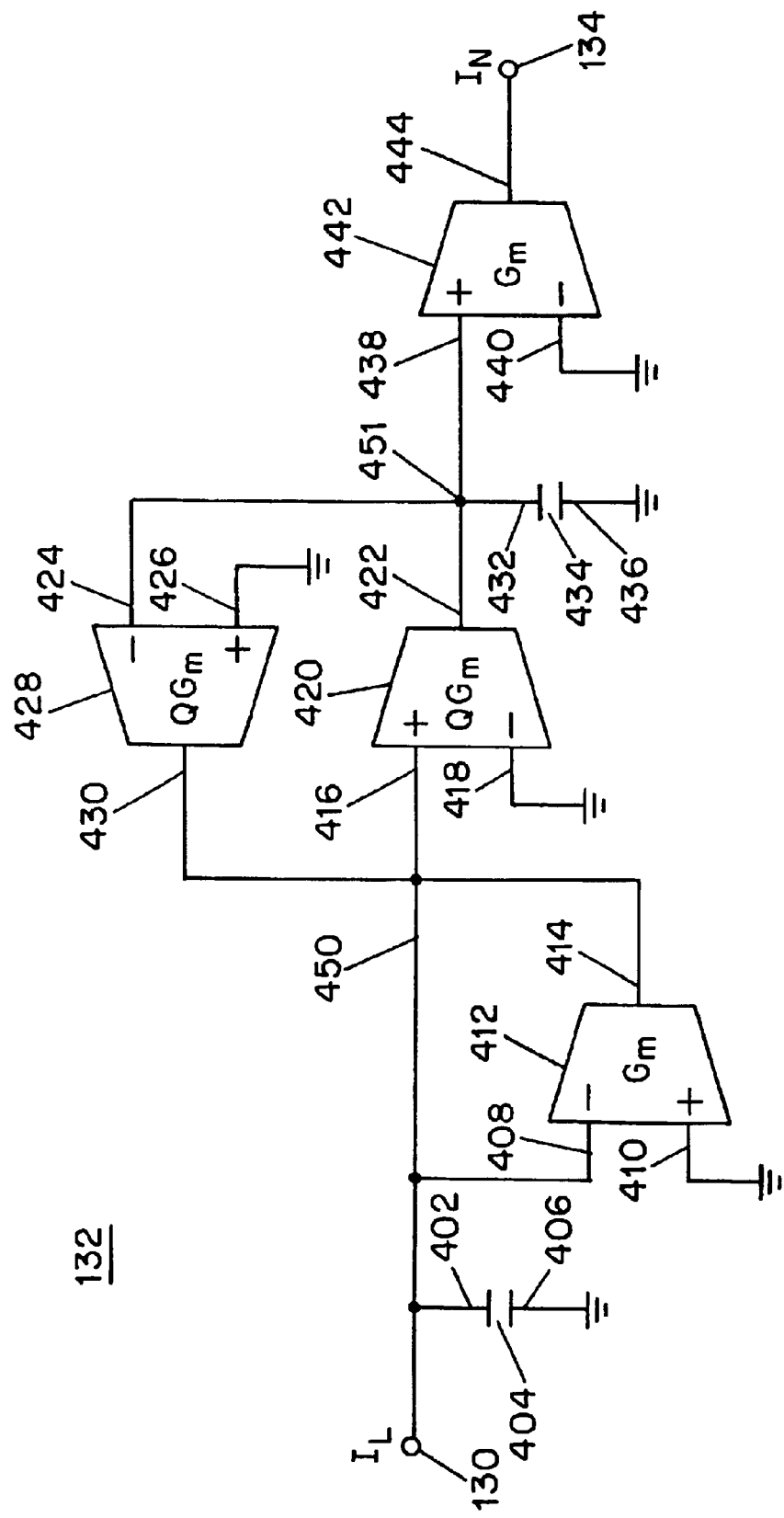
FIG. 4 is a circuit diagram illustrating a main filter in accordance with the present invention.

FIG. 4 illustrates an exemplary embodiment of the main filter 132 which is in the form of a standard Tow-Thomas biquad. The main filter 132 includes a transconductor 412, a transconductor 420, a transconductor 428, a transconductor 442, a capacitor 404, and a capacitor 434. The center frequency $\omega_0$ of the main filter 132 can be calculated by the equation:

$$\omega_0 = Q\ G_m/C \qquad (1)$$

where Q is the quality factor of the main filter 132. The absolute value of the transconductors and capacitors can be scaled by the same factor, i.e., impedance scaling, without affecting the transfer function of the main filter 132, since the transfer function depends on the ratios between these values. Impedance scaling does not change the transfer function of the main filter 132, however it does change the power dissipation and the noise level of the main filter 132.

A signal received by the input 130 of the main filter 132 is applied to a terminal 402 of the capacitor 404, a negative input 408 of the transconductor 412, an output 414 of the transconductor 412, a positive input 416 of the transconductor 420, and an output 430 of the transconductor 428. These connections form a node 450. The other terminal 406 of the capacitor 404 is connected to ground. The capacitor 404 integrates the current signals provided to node 450 by the outputs of transconductors.

The transconductor 412 operates on the difference between the voltage signal received at a positive input 410, which is connected to ground and the voltage signal received at the negative input 408, and provides a current signal at its output 414. The signal at the current output 414 of the transconductor 412 is equal to the difference between the voltage signal received by its positive input 410, which is connected to ground, and the signal received by its negative input 408, which is the voltage at terminal 402 of the capacitor 404, scaled by its transconductance $G_m$. As explained above, the output 414 of the transconductor 412 together with one terminal 402 of the capacitor 404, the negative input 408 of the transconductor 412, the input 130, the positive input 416 of the transconductor 420 and the output 430 of the transconductor 428 form node 450. The transconductor 412 forms a feedback loop with the node 450.

The transconductor 420 operates on the difference between the voltage signal received at its positive input 416, which is the voltage at terminal 402 of the capacitor 404, and the voltage signal received at its negative input 418, which is connected to ground, and provides a current signal at its output 422. The current signal at the output 422 is equal to the difference between the voltage signal received by the positive input 416, which is node 450, and the voltage signal received by the negative input 418, scaled by a transconductance $QG_m$. The output 422 of the transconductor 420 together with one terminal 432 of a capacitor 434, a positive input 438 of the transconductor 442, and a negative input 424 of the transconductor 428 form node 451. The other terminal 436 of the capacitor 434 is connected to ground. The capacitor 434 integrates the current provided to node 451 by the output 422 of transconductor 420.

The transconductor 428 operates on the difference between the voltage signal received at its positive input 426, which is connected to ground and the voltage signal received at its negative input 424, which is voltage at terminal 432 of the capacitor 434, and provides a signal at its output 430 which is node 450. The current signal at the output 430, which is node 450, is equal to the difference in the signal received by the positive input 426 and the signal received by the negative input 424, which is node 451, of the transconductor 428, scaled by a transconductance $QG_m$.

The transconductor 442 operates on the difference between the signal received at its positive input 438, which is the voltage at terminal 432 of the capacitor 434, and the voltage signal received at its negative input 440, which is connected to ground, and provides a current signal at an output 444. The signal at the output 444 is equal to the difference between the voltage signal received by the positive input 438, which is node 451, and the signal received by the negative input 440 of the transconductor 442, scaled by a transconductance $G_m$. The output 444 of the transconductor 442 is coupled to the output 134 of the main filter 132. In an exemplary embodiment of the main filter 132, the capacitance of the capacitors 404 and 434 are each 80 v|, the quality factor, Q, is 20, and the transconductance $G_m$ is 50.

In another exemplary embodiment of the main filter 132, a first diode (not shown) and a second diode (not shown) are connected to the node 450. The cathode of the first diode is connected to the node 450 and an anode of the first diode is connected to ground. The anode of the second diode is connected to the node 450 and a cathode of the second diode is connected to ground. This arrangement limits the voltage swing at the node 450 to approximately ±0.7 volts.

In still another exemplary embodiment of the main filter 132, a first diode (not shown) and a second diode (not shown) are connected to the input 130. The cathode of the first diode is connected to the input 130 and an anode of the first diode is connected to ground. The anode of the second diode is connected to the input 130 and a cathode of the second diode is connected to ground. This arrangement limits the voltage swing at the input 130 to approximately ±0.7 volts.

In yet another exemplary embodiment of the main filter 132, a first diode (not shown) and a second diode (not shown) are connected to the output 134. The cathode of the first diode is connected to the output 134 and an anode of the first diode is connected to ground. The anode of the second diode is connected to the output 134 and a cathode of the second diode is connected to ground. This arrangement limits the voltage swing at the output 134 to approximately ±0.7 volts.

Figure 5:
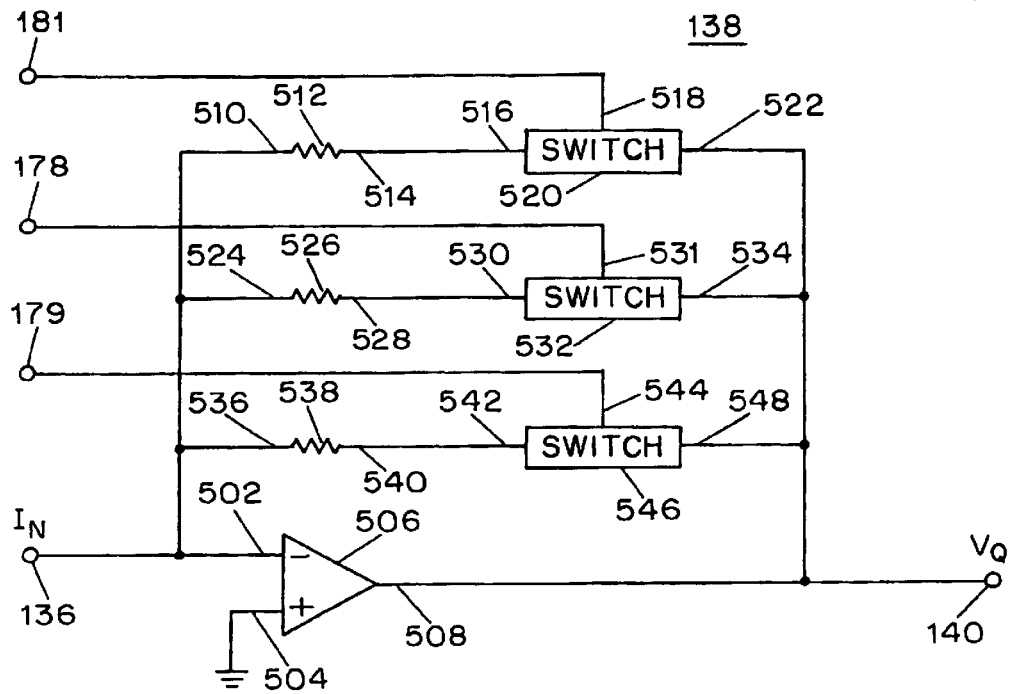
FIG. 5 is a circuit diagram illustrating a main filter output gain unit in accordance with the present invention.

FIG. 5 illustrates an exemplary embodiment of the main filter output gain unit 138. The main filter output gain unit 138 provides a dynamically alterable output gain for the output of the main filter 132. The main filter output gain unit 138 includes a first switch 520, a second switch 532, a third switch 546, a first resistor 512, a second resistor 526, a third resistor 538, and an operational amplifier 506. In the present embodiment, the operational amplifier 506 may be a model LF347 operational amplifier available from National Semiconductor Corporation in Santa Clara, Calif. Switches 520, 532 and 546 may each be implemented as a CMOS transmission gate.

A signal received at the input 136 of the main filter input gain unit 126 is applied to a negative input 502 of the operational amplifier 506, one terminal 510 of the first resistor 512, one terminal 524 of the second resistor 526 and one terminal 536 of the third resistor 538; a first gain control signal received at the input 181 is applied to a switch control terminal 518 of the first switch 520; a second gain control signal received at the input 178 is applied to a switch control terminal 531 of the second switch 532; and a third gain control signal received at the input 179 is applied to a switch control terminal 544 of the third switch 546. The other terminal 514 of the first resistor 512 is connected to one terminal 516 of the first switch 520. The first resistor 512 may have a relatively low resistance value. In the present example, the first resistor 512 has a value of $1/10\, G_m$, where $G_m$ is in the transconductance of the transconductor 332 of the main filter input gain unit 126 depicted in FIG. 3. The other terminal 528 of the second resistor 526 is connected to one terminal 530 of the second switch 532. The second resistor 526 may have a relatively high resistance value. In the present example, the second resistor 526 has a value of $10/G_m$. The other terminal 540 of the third resistor 538 is connected to one terminal 542 of the third switch 546. The third resistor 538 may relatively moderate resistance value. In the present example, the third resistor 538 has a value of $1/G_m$.

Terminal 522 of the first switch 520 is connected to terminal 534 of the second switch 532, terminal 548 of the third switch 546, the output 508 of the operational amplifier 506, and the output 140 of the main filter output gain unit 138. The first switch 520 closes to connect its terminal 516 to its other terminal 522 if the signal received at the switch control terminal 518 is at a logical one voltage level. If the signal at the switch control terminal 518 of the first switch 520 is at a logical zero voltage level, the first switch 520 opens to disconnect its terminal 516 from its other terminal 522 resulting in an open circuit between the terminals.

Terminal 534 of the second switch 532 is connected to terminal 522 of the first switch 520, terminal 548 of the third switch 546, the output 508 of the operational amplifier 506, and the output 140 of the main filter output gain unit 138. The second switch 532 closes to connect its terminal 530 to its other terminal 534 if the signal received at the switch control terminal 531 of the second switch 532 is at a logical one voltage level. If the signal at the switch control terminal 531 is at a logical zero voltage level, the second switch 532 opens to disconnect its terminal 530 from its other terminal 534 resulting in an open circuit between the two terminals.

Terminal 548 of the third switch 546 is connected to terminal 522 of the first switch 520, terminal 534 of the second switch 532, the output 508 of the operational amplifier 506, and the output 140 of the main filter output gain unit 138. The third switch 546 closes to connect its terminal 542 to its other terminal 548 if the signal received at the switch control terminal 544 of the third switch 546 is at a logical one voltage level. If the signal at the switch control terminal 544 is at a logical zero voltage level, the second switch 546 opens to disconnect its terminal 542 from its other terminal 548 resulting in an open circuit between the two terminals.

The operational amplifier 506 amplifies the difference between the signal received at its positive input 504, which is connected to ground, and the signal received at its negative input 502 by an amplification factor and provides the amplified signal at its output 508. The signal produced at the output 508 is conveyed to the output 140 of the main filter output gain unit 138.

Figure 6:
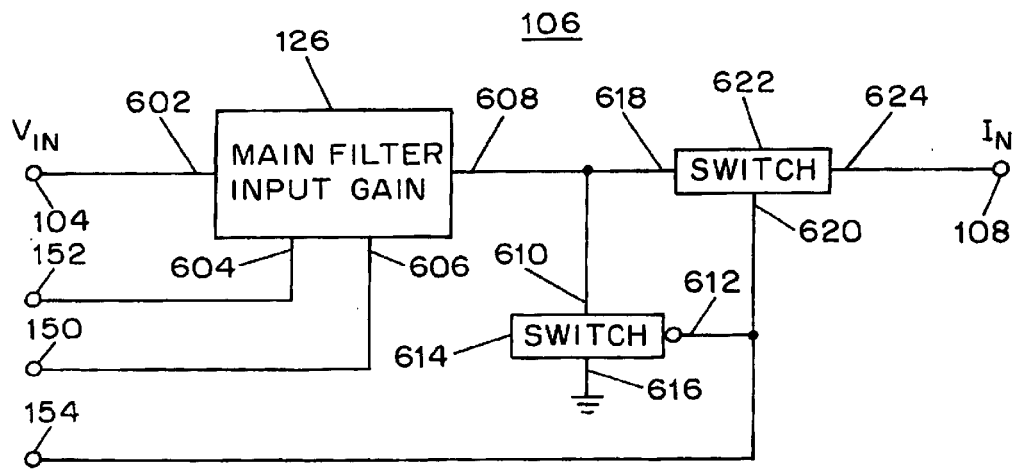
FIG. 6 is a circuit diagram illustrating an auxiliary filter input gain unit in accordance with the present invention.

FIG. 6 illustrates an exemplary embodiment of the auxiliary filter input gain unit 106. The auxiliary filter input gain unit 106 amplifies the signal received at its input 104 by one of three amplification factors, and provides an appropriate amplified signal to its output 108. The auxiliary filter input gain unit 106 includes the main filter input gain unit 126, a first switch 614, and a second switch 622. Switches 614, 622 may each be implemented as a CMOS transmission gate.

A signal received at the input 104 of the auxiliary filter input gain unit 106 is applied to an input 602 of the main filter input gain unit 126; a signal received at the input 152 of the auxiliary filter input gain unit 106 is applied to an input 604 of the main filter input gain unit 126; a signal received at the input 150 of the auxiliary filter input gain unit 106 is applied to an input 606 of the main filter input gain unit 126; and a signal received at an input 154 is applied to an inverted switch control terminal 612 of the first switch 614 and a switch control terminal 620 of the second switch 622. The main filter input gain unit 126 amplifies the signal received at its input 602 by an amplification factor that depends on the signals received at its inputs 604, 606, as described above in relation to FIG. 3, and produces a signal at its output 608. The inputs 602, 604, 606 of the main filter input gain unit 126 correspond to the inputs 124, 158, 156, shown in FIG. 3, respectively, and the output 608 correspond to the output 128, shown in FIG. 3. The output 608 of the main filter input gain unit 126 is connected to a terminal 610 of the first switch 614, and a terminal 618 of the second switch 622.

One terminal 616 of the first switch 614 is connected to ground. The first switch 614 closes to connect its terminal 610 to its other terminal 616 if the signal received at the inverted switch control terminal 612 is at a logical zero voltage level. If the signal at the inverted switch control terminal 612 is at a logical one voltage level, the first switch 614 opens to disconnect its terminal 610 from its other terminal 616 resulting in an open circuit between the two terminals.

One terminal 624 of the second switch 622 is connected to the output 108 of the auxiliary filter input gain unit 106. The second switch 622 closes to connect its terminal 618 to its other terminal 624 if the signal received at its switch control terminal 620 is at a logical one voltage level. If the signal at the switch control terminal 620 is at a logical zero voltage level, the second switch 622 opens to disconnect its terminal 618 from its other terminal 624 resulting in an open circuit between the two terminals.

Figure 21:
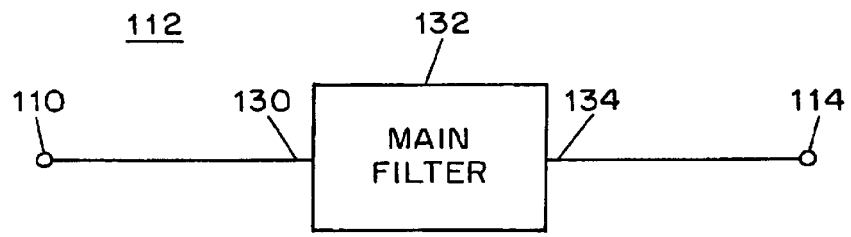

FIG. 21 illustrates an exemplary embodiment of the auxiliary filter 112. The auxiliary filter 112 includes the input 110, the main filter 132 and the output 114. A signal received by the input 110 of the auxiliary filter 112 is applied to the input 130 of the main filter 132. The structure and function of the main filter 132 is described above in relation to FIG. 3. The main filter 132 produces a processed signal at its output 134, which is connected to the output 114.

Figure 7:
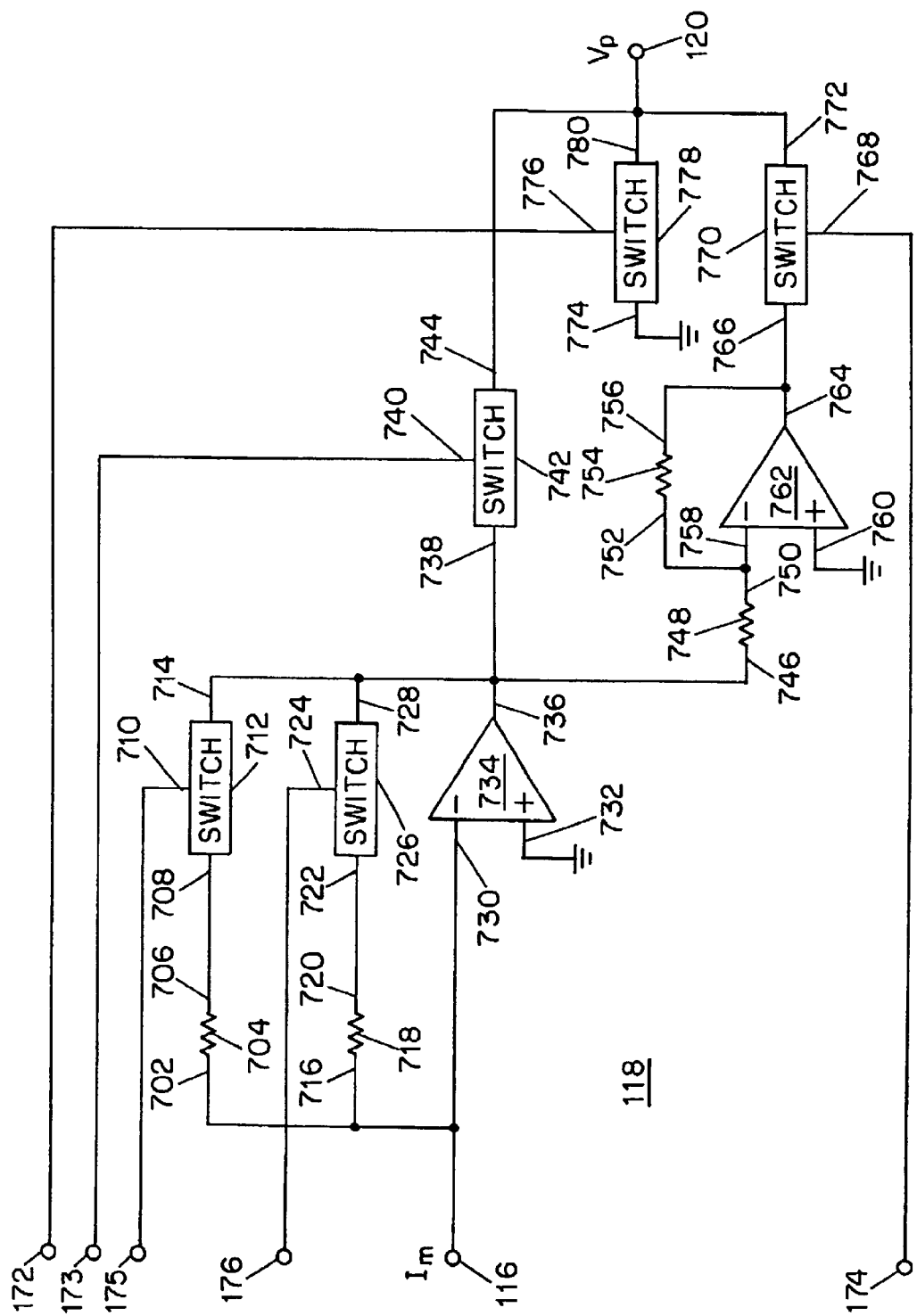
FIG. 7 is a circuit diagram illustrating an auxiliary filter output gain unit in accordance with the present invention.

FIG. 7 illustrates an exemplary embodiment of the auxiliary filter output gain unit 118. The auxiliary filter output gain unit 118 provides a selectively enabled, dynamically alterable output gain for the auxiliary filter 106. The auxiliary filter output gain unit 118 includes a first operational amplifier 734, a second operational amplifier 762, a first resistor 704, a second resistor 718, a third resistor 748, a fourth resistor 754, a first switch 712, a second switch 726, a third switch 742, a fourth switch 770, and a fifth switch 778. In the present embodiment, the first operational amplifier 734 and the second operational amplifier 762 are model LF347 operational amplifiers available from National Semiconductor Corporation of Santa Clara, Calif. Switches 712, 726, 742, 770 and 778 may be each be implemented as CMOS transmission gates.

A signal received at the input 116 of the auxiliary filter output gain unit 118 is applied to a negative input 730 of the first operational amplifier 734, one terminal 702 of the first resistor 704, and one terminal 716 of the second resistor 718; a signal received at the input 175 of the auxiliary filter output gain unit 118 is applied to the switch control terminal 710 of the first switch 712; a signal received at the input 176 of the auxiliary filter output gain unit 118 is applied to the switch control terminal 724 of the second switch 726; a signal received at the input 173 of the auxiliary filter output gain unit 118 is applied to the switch control terminal 740 of the third switch 742; a signal received at the input 174 of the auxiliary filter output gain unit 118 is applied to the switch control terminal 768 of the fourth switch 770; and a signal received at the input 172 of the auxiliary filter output gain unit 118 is applied to the switch control terminal 776 of the fifth switch 778. The other terminal 706 of the first resistor 704 is connected to one terminal 708 of the first switch 712. The first resistor 704 has a relatively low resistance value. In the present example, the resistance of the first resistor 704 is 9/10 $G_m$ where $G_m$ is the transconductance of transconductors 332 of the main filter input gain unit 126 depicted in FIG. 3. The other terminal 720 of the second resistor 718 is connected to one terminal 722 of the second switch 726. The second resistor 718 has a relatively high resistance value. In the present example, the resistance of the second resistor 718 is $9/G_m$.

Terminal 714 of the first switch 712 is connected to terminal 728 of the second switch 726, an output 736 of the first operational amplifier 734, one terminal 738 of the third switch 742, and one terminal 746 of the third resistor 748. The first switch 712 closes to connect its terminal 708 to its other terminal 714 if the signal received at its switch control terminal 710 is a logical one voltage level. If the signal at the switch control terminal 710 is at a logical zero voltage level, the first switch 712 opens to disconnect its terminal 708 from its other terminal 714 resulting in an open circuit between the two terminals.

Terminal 728 of the second switch 726 is connected to the terminal 714 of the first switch 712, the output 736 of the operational amplifier 734, terminal 738 of the third switch 742, and one terminal 746 of the third resistor 748. The second switch 726 closes to connect its terminal 722 to its other terminal 728 if the signal received at its switch control terminal 724 is a logical one voltage level. If the signal at the switch control terminal 724 is at a logical zero voltage level, the second switch 726 opens to disconnect its terminal 722 from its other terminal 728 resulting in an open circuit between the two terminals.

The first resistor 704, the first switch 712, the second resistor 718, the second switch 726 and the operational amplifier 736 form an amplifier having a variable amplification factor. If input 175 receives a logical one voltage level signal and input 176 receives a logical zero level signal so that the first switch 712 is closed and the second switch 726 is open, the amplification factor between input 116 and the output 736 of the operational amplifier 734 is in the present example −9/10. If input 175 receives a logical zero voltage level signal and input 176 receives a logical one voltage level signal so that the first switch 712 is open and the second switch 726 is closed, the amplification factor between the input 116 and the output 736 of the operational amplifier 736 is −9.

Terminal 744 of the third switch 742 is connected to terminal 772 of the fourth switch 770, terminal 780 of the fifth switch 778, and the output 120 of the auxiliary filter output gain unit 118. The third switch 742 closes to connect its terminal 738 to its other terminal 744 if the signal received at its switch control terminal 740 is at a logical one voltage level. If the signal at the switch control terminal 740 is a logical zero voltage level, the third switch 742 opens to disconnect its terminal 738 from its other terminal 744 resulting in an open circuit between the two terminals.

The other terminal 750 of the third resistor 748 is connected to one terminal 752 of the fourth resistor 754, and the negative input 758 of the second operational amplifier 762. The third resistor 748, the fourth resistor 754, and the operational amplifier 762 form an inverting amplifier having an amplification factor serial to the negative ratio of the resistance of the fourth resistor 754 to the resistance of the third resistor 748. The inverting amplifier amplifies the signal received at terminal 746 of the third resistor 748 by such amplification factor and provides the amplified signal at its output 764. The signal produced at the output 764 is applied to terminal 766 of the fourth switch 770.

The other terminal 772 of the fourth switch 770 is connected to terminal 744 of the third switch 742, the terminal 780 of the fifth switch 778 and the output 120 of the auxiliary filter output gain unit 118. The fourth switch 770 closes to connect its terminal 766 to its other terminal 772 if the signal received at its switch control terminal 768 is at a logical one voltage level. If the signal at the switch control terminal 768 is at a logical zero voltage level, the fourth switch 770 opens to disconnect its terminal 766 from its other terminal 772 resulting in an open circuit between the two terminals.

Terminal 774 of the fifth switch 778 is connected to ground. The other terminal 780 of the fifth switch 778 is connected to terminal 744 of the third switch 742, terminal 772 of the fifth switch 770, and the output 120 of the auxiliary filter output gain unit 118. The fifth switch 778 closes to connect its terminal 774 to its other terminal 780 if the signal received at its switch control terminal 776 is at a logical one voltage level. If the signal at the switch control terminal 776 is at a logical zero voltage level, the fifth switch 778 opens to disconnect its terminal 774 from its other terminal 780 resulting in an open circuit between the two terminals operation of the auxiliary filter output gain unit is not adequately described.

Figure 8:
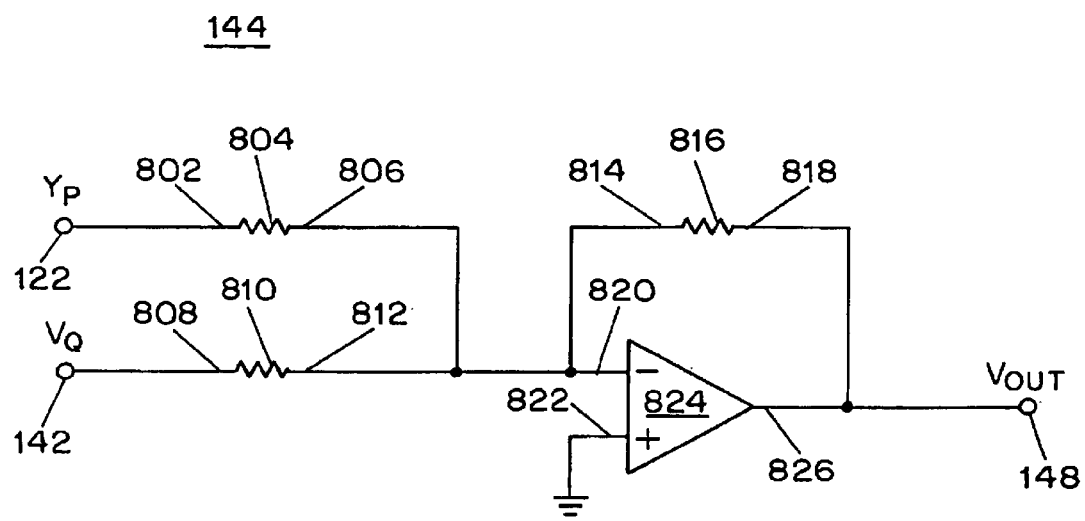
FIG. 8 is a circuit diagram illustrating a signal adder in accordance with the present invention.

FIG. 8 illustrates an exemplary embodiment of the signal adder unit 144. The signal adder unit 144 combines the signals received at the input 122 and the input 142. The signal adder unit 144 includes an operational amplifier 824, a first resistor 804, a second resistor 810, and a third resistor 816. In the present embodiment, the operational amplifier 824 is model LF347 operational amplifier available from National Semiconductor Corporation of Santa Clara, Calif.

A signal received at the input 122 of the signal adder unit 144 is applied to one terminal 802 of the first resistor 804; a signal received at the input 142 of the signal adder unit 144 is applied to one terminal 808 of the second resistor 810. The other terminal 806 of the first resistor 804 is connected to the other terminal 812 of the second resistor 810, one terminal 814 of the third resistor 816 and the negative input 820 of the operational amplifier 824. The other terminal 818 of the third resistor 816 is connected to an output 826 of the operational amplifier 824 and the output 148 of the signal adder unit 144.

If the signal received at input 122 is $V_P$, the signal received at input 142 is $V_Q$ and the signal at the output 148 is $V_{out}$, then $V_{out}$ may be expressed as [EQ] where $R_1$ is the resistance of the first resistor 804, $R_2$ is the resistance of the second resistor 810 and $R_F$ is the resistance of the third resistor 816.

Figure 9:
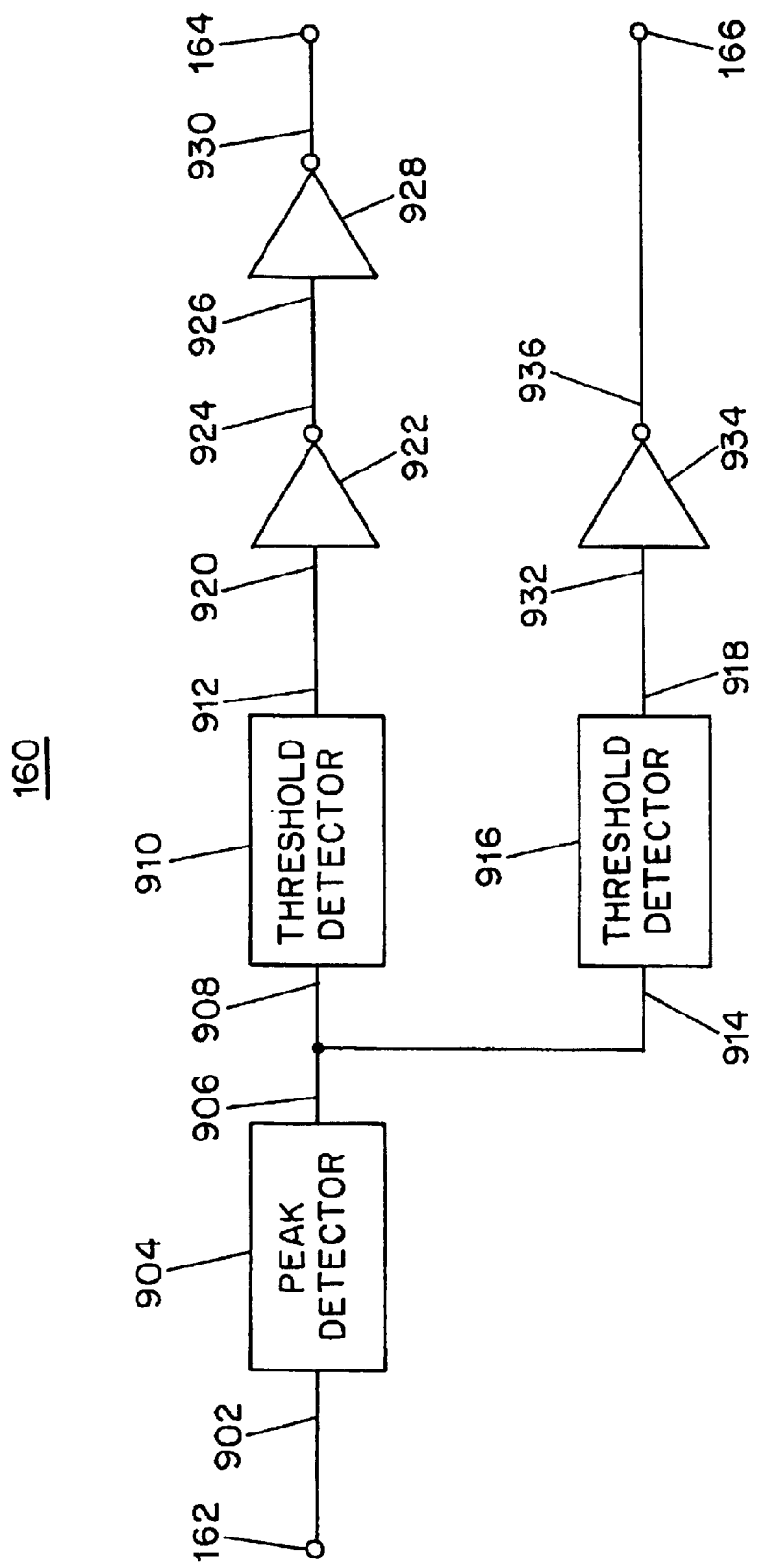
FIG. 9 is a block diagram illustrating a strength detector in accordance with the present invention.

Referring to FIG. 9, there is shown an exemplary embodiment of the strength detector 160 as shown in FIG. 2. The strength detector 160 includes an input 162, a peak detector 904, a first threshold detector 910, a second threshold detector 916, a first inverter gate 922, a second inverter gate 928, a third inverter gate 934, a first output 164, and a second output 166. The peak detector 904 and the first threshold detector 910 are described in more detail below in relation to FIG. 10 and FIG. 11, respectively. The strength detector 160 senses the voltage envelope of the signal received at the input 162, and decides whether it would be appropriate to change amplification factors of the main filter input gain unit 126, the main filter output gain unit 138, the auxiliary filter input gain unit 106 and the auxiliary filter output gain unit 118. The saturation threshold limit represents the input signal strength at which the main filter 132 approaches saturation. The noise floor threshold limit represents the input signal strength at which the output signal of the main filter 132 has a minimum acceptable signal-to-noise ratio.

A signal received at the input 162 of the strength detector 160 is applied to an input 902 of the peak detector 904. The peak detector 904 receives an input voltage signal at its input 902 and provides a current signal representative of the peak of the voltage envelope of the input signal at an output 906 of the peak detector 904. The output 906 of the peak detector 904 is coupled to an input 908 of the first threshold detector 910 and an input 914 of the second threshold detector 916. The first threshold detector 910 provides a logical one voltage level on its output 912 if the signal at its input 908 represents an input signal voltage envelope peak greater than the saturation threshold limit, and provides a logical zero voltage level on its output 912 if the signal at the input 908 represents an input signal voltage envelope peak less than the saturation threshold limit. The output 912 of the first threshold detector 910 is coupled to an input 920 of the first inverter gate 922. The second threshold detector 916 provides a logical one voltage level on its output 918 if the signal at its input 914 represents an input signal voltage envelope peak greater than the noise floor threshold limit, and provides a logical zero voltage level on its output 918 if the signal at its input 914 represents an input signal voltage envelope peak less than the noise floor threshold limit. The output 918 of the second threshold detector 916 is coupled to the input 932 of the third inverter gate 934.

The inverter gate 922 inverts the signal received at its input 920, and provides the inverted signal at its output 924. The output 924 is connected to the input 926 of the second inverter gate 928. The second inverter gate 928 inverts the signal received at its input 926, and provides the inverted signal at the output 930. The output 930 is couple, first to the output 164 of the strength detector 160. The third inverter gate 934 inverts the signal received at its input 932, and provides the inverted signal at its output 936. The output 936 is connected to the second output 166 of the strength detector 160.

Figure 10:
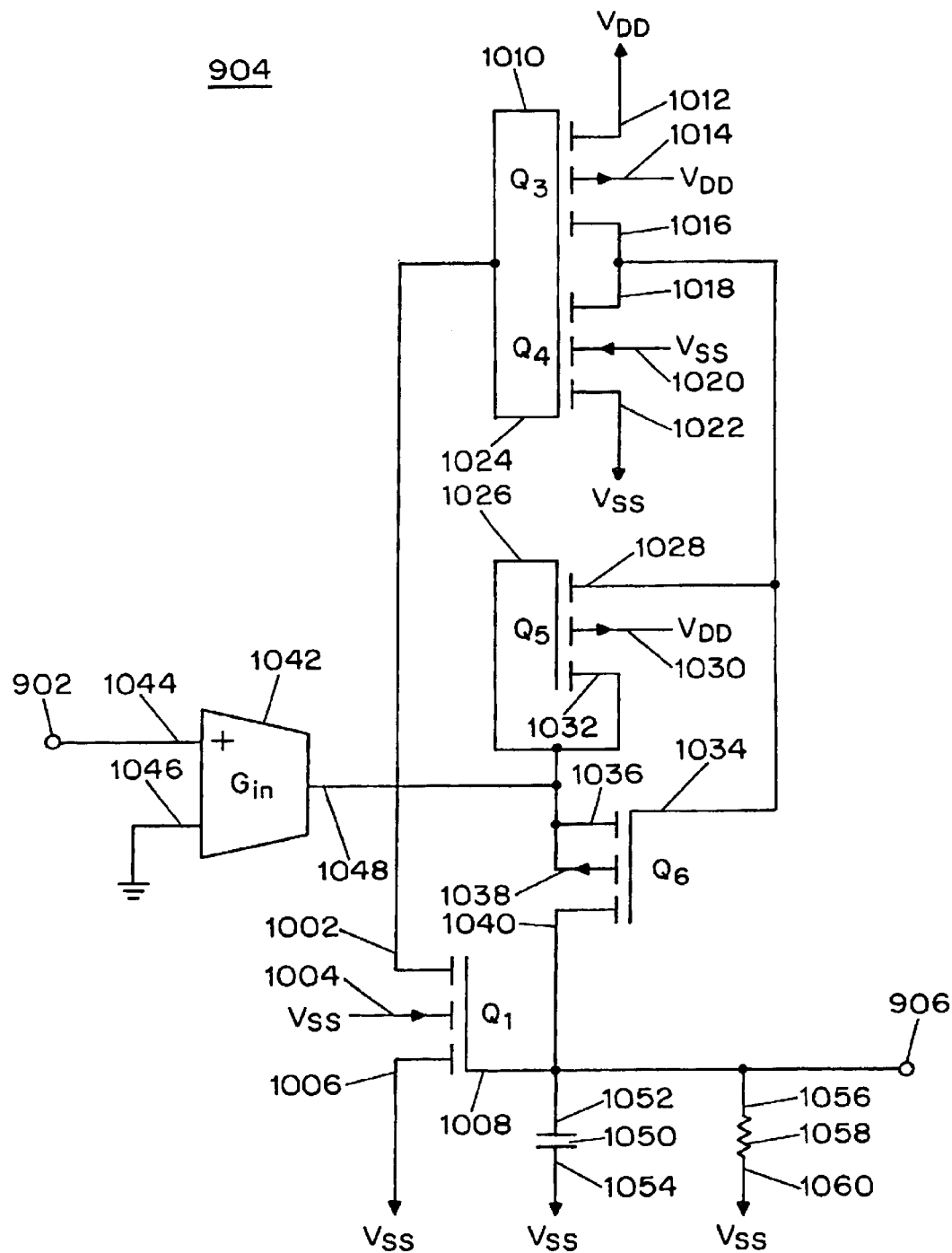
FIG. 10 is a circuit diagram illustrating a peak detector in accordance with the present invention.

FIG. 10 illustrates an exemplary embodiment of the peak detector 904 of the strength detector 160 of FIG. 9 in greater detail. The peak detector 904 includes an NMOS transistor $Q_1$, a PMOS transistor $Q_3$, an NMOS transistor $Q_4$, a PMOS transistor $Q_5$, a PMOS transistor $Q_6$, a capacitor 1050, a resistor 1058 and a transconductor 1042.

A signal received by the input 902 of the peak detector 904 is applied to a positive input 1044 of the transconductor 1042. The transconductor 1042 provide at its output 1048 a signal which is equal to the difference in the signal received by its positive input 1044 and the signal received by the negative input 1046, which is connected to ground, scaled by a transconductance $G_{in}$ of the transconductor 1042. In the present embodiment the transconductor 1042 has a transconductance $G_{in}$ of 1 microampere per volt. The signal provided at the output 1048 of the transconductor 1042 is applied to the gate 1010 of the PMOS transistor $Q_3$ and the gate 1024 of the NMOS transistor $Q_4$, which form an inverter, the gate 1026 and the drain 1032 of the diode connected PMOS transistor $Q_5$, the source 1036 and the backgate 1038 of the PMOS transistor $Q_6$, and the drain 1002 of the NMOS transistor $Q_1$. The inverter formed by the PMOS transistor $Q_3$ and the NMOS transistor $Q_4$ are connected between supply voltages $V_{DD}$ and $V_{SS}$, and the commonly connected drains of PMOS transistor $Q_3$ and NMOS transistor $Q_4$ are connected to the source 1028 of diode 30 connected PMOS transistor $Q_5$ and the gate 1034 of PMOS transistor $Q_6$. The back gates 1014 and 1020 of the PMOS transistor $Q_3$ and the NMOS transistor $Q_4$ are connected to supply voltage $V_{DD}$ and $V_{SS}$, respectively. The commonly connected gate 1026 and drain 1032 of the diode connected PMOS transistor $Q_5$ are connected to the drain 1036 and backgate 1038 of PMOS transistor $Q_6$. The back gate 1030 of diode connected PMOS transistor is connected to supply voltage $Q_{DD}$. The source 1040 of the PMOS transistor $Q_6$ is connected to the gate 1048 of NMOS transistor $Q_1$, one terminal of capacitor 1050, one terminal 1056 of the resistor 1058 and output terminal 906. The other terminal of capacitor 1050 and the other terminal 1060 of the resistor 1058 are connected to supply voltage $Q_{SS}$. The drain 1002 of NMOS transistor $Q_1$ is connected to the output 1048 of the transconductor 1048 transconductor 1042, the drain 1036 and the backgate 1038 of PMOS transistor $Q_6$, the commonly connected gate 1026 and drain 1032 of diode connected PMOS transistor $Q_5$, and commonly connected gates 1010 and 1024 of the PMOS transistor $Q_3$ and the NMOS transistor $Q_4$ of the inverter. The source 1006 of the NMOS transistor $Q_1$ is connected to supply voltage $Q_{SS}$.

The NMOS transistor $Q_1$ of the peak detector 904 forms half of a NMOS current mirror. The other half of the current mirror consists of an NMOS transistor $Q_2$ of the threshold detector 910 (shown in FIG. 11). Thus, when the output 906 of the peak detector 904 is connected to the input 908 of the threshold detector 910, a complete NMOS current mirror is formed which acts as a current memory storing the peak current, i.e., the current that represents the voltage envelope peak of input signal of the main filter. The CMOS inverter formed by PMOS transistor $Q_3$ and NMOS transistor $Q_4$ acts as a current comparator which compares the current provided by the output 1048 of the transconductor 1042 with the drain current of NMOS transistor $Q_1$.

When the drain current of NMOS transistor $Q_1$ is larger that the current provided by the output 1048 of the transconductor 1042, the commonly connected gates 1010 and 1024 of the PMOS transistor $Q_3$ and the NMOS transistor $Q_4$ forming the inverter is at a logical low voltage level (i.e., $V_{SS}$) and the commonly connected drains 1016 and 1018 of those transistors are at a logical one voltage level (i.e., $V_{DD}$). Because the gate 1034 of PMOS transistor $Q_6$ is connected to the commonly connected drains 1016 and 1018 of the inverter, it is also at the logical one voltage level, PMOS transistor $Q_6$ is turned off. If the current provided by the output 1048 of the transconductor 1042 becomes larger than the drain current of NMOS transistor $Q_1$, the commonly connected gates 1010 and 1024 of PMOS transistor $Q_3$ and NMOS transistor $Q_4$ switches to a logical one voltage level and the commonly connected drains 1016 and 1018 of those transistors switches to a logical zero voltage level; this causes the gate 1034 of the PMOS transistor $Q_6$ to go to the logical zero voltage level and PMOS transistor $Q_6$ to turn on. In this manner, PMOS transistor $Q_6$ connects the gates 1008 and 1102 (shown in FIG. 11) of NMOS transistors $Q_1$ and $Q_2$, one terminal 1052 of capacitor 1050 and terminal 1056 of the resistor 1058 to the output 1048 of the transconductor 1042, and the current mirror follows the current provided by the output 1048 of transconductor 1042. When the current provided by the output 1048 of the transconductor 1042 starts to fall below the new peak current, the commonly connected drains 1016 and 1018 of PMOS transistor $Q_3$ and NMOS transistor $Q_4$ switches back to a logical one voltage level causing PMOS transistor $Q_6$ to turn off leaving the gates 1008 and 1102 (shown in FIG. 11) of NMOS transistors at the voltage on the terminal 1052 of the capacitor 1050, thus allowing the NMOS current mirror to hold the new peak current, though the new peak current degrades as the capacitor 1050 discharges through the resistor 1058. Thereafter, the diode connected PMOS transistor $Q_5$ starts to supply the difference between the output of 1048 of the transconductor 1042 and the drain current provided by the current of the NMOS transistor $Q_1$ to the node formed by the output 1048 of the transconductor 1043, the drain of NMOS transistor $Q_1$ and the commonly connected gates 1010 and 1024 of PMOS transistor $Q_3$ and NMOS transistor $Q_4$.

Figure 11:
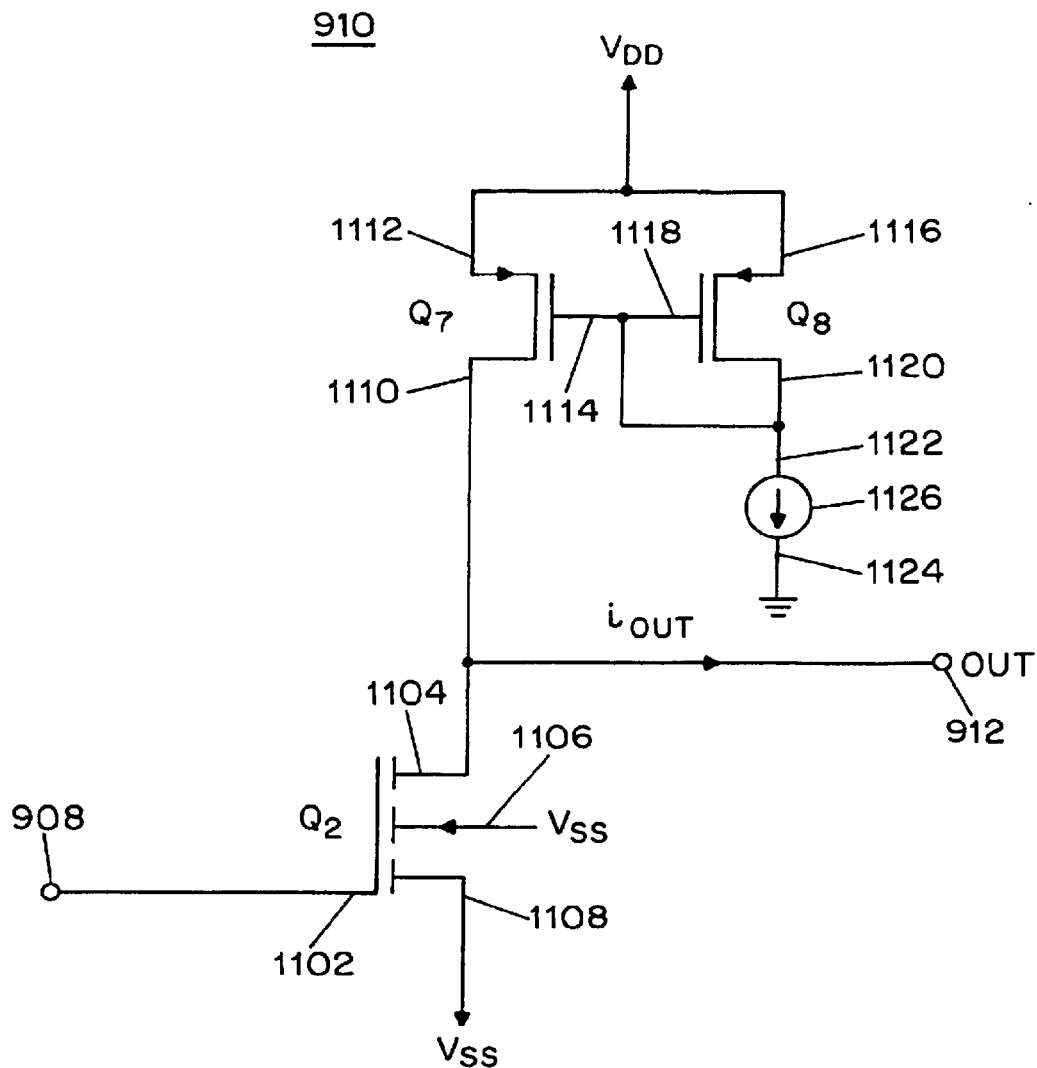
FIG. 11 is a circuit diagram illustrating a threshold detector in accordance with the present invention.

FIG. 11 illustrates the first threshold detector 910 of the strength detector 160 of FIG. 9 in greater detail. The first threshold detector 910 compares the current representing of the voltage envelope of a signal received at the input 902 of the peak detector 904 to a reference current supplied by a current source 1126. The first threshold detector 910 includes an NMOS transistor $Q_2$, a PMOS transistor $Q_7$, a PMOS transistor $Q_8$, and the current source 1126. Any number of threshold detectors can be connected to the peak detector 904 to derive a corresponding number of signal strength detector outputs. A signal received by the input 908 of the first threshold detector 910 is applied to the gate 1102 of the NMOS transistor $Q_2$.

As explained above in connection with FIG. 10, the NMOS transistor $Q_2$ of the first threshold detector 910 forms half of an NMOS current mirror that acts as a current memory which stores the peak current corresponding to the peak voltage envelope of the signal received at the input 902 of the peak detector 904. The other half of the NMOS current mirror that acts as a current memory consists of the NMOS transistor $Q_1$ of the peak detector 904, shown in FIG. 10, which is connected to the input 908 of the first threshold detector 910. The source 1108 of the NMOS transistor $Q_2$ is connected to supply voltage $V_{ss}$. The drain 1104 of the NMOS transistor $Q_2$ is connected to the drain 1110 of the PMOS transistor $Q_7$. The gate 1102 of the NMOS transistor $Q_2$ is connected to the input 908 of the first threshold detector 910. The backgate 1106 of the NMOS transistor $Q_2$ is connected to supply voltage $V_{ss}$.

The NMOS transistor $Q_7$, the NMOS transistor $Q_8$ and the current source 1126 form a current mirror that causes a current to flow through the NMOS transistor $Q_7$ that mirrors the current of the current source 1126. The gate 1114 of the NMOS transistor $Q_7$ is connected to the gate 1118 of the NMOS transistor $Q_8$, the drain 1120 of the NMOS transistor $Q_8$, and the positive terminal 1122 of the current source 1126. The source 1112 of the NMOS transistor $Q_7$ is connected to supply voltage $V_{dd}$ and the source 1116 of the NMOS transistor $Q_8$. The drain 1110 of the NMOS transistor $Q_7$ is connected to the drain 1104 of the NMOS transistor $Q_2$ and the output 912 of the threshold detector 910. The gate 1118 of NMOS transistor $Q_8$ is connected to the drain 1120 of the NMOS transistor $Q_8$, the gate 1114 of the NMOS transistor $Q_7$ and the positive terminal 1122 of the current source 1126. The source 1116 of the NMOS transistor $Q_8$ is connected to the source 1112 of the NMOS transistor $Q_7$ and supply voltage $V_{dd}$. The negative terminal 1124 of the current source 1126 is connected to ground.

The current source 1126 produces a reference current that represents the threshold voltage of the first threshold detector 910. The reference current can be any value, for example 100 uA, and the transistors $Q_7$, $Q_8$ of the first threshold detector 910 are scaled to cause the desired current to flow through the transistor $Q_7$. The preferred form of a current source is a resistance connected between the drain 1120 of NMOS transistor $Q_8$ and ground. In the present example the reference current generated by the current source in the first threshold detector 910 is 5.5 MA.

The output 912 of the first threshold detector 910 indicates whether the respective amplification factors of the main filter input gain unit 126 and the auxiliary filter input gain unit 106 should be decreased given the voltage envelope of the signal received at the input 902 of the peak detector 904. If the current flowing through the transistor $Q_2$, which represents the voltage envelope peak of the signal received at the input 902 of the peak detector 904, exceeds the current flowing through the transistor $Q_7$, which is related to the reference current of the current source 1126, the output 912 of the first threshold detector 910 will be at a logical zero voltage level. If the current flowing through the transistor $Q_2$ does not exceed the current flowing through the transistor $Q_7$, the output 912 of the first threshold detector 910 will be at a logical one voltage level. In this manner, the saturation threshold limit of the signal strength detector 160 is represented by the amount of current generated by the current source 1126.

In an exemplary embodiment the second threshold detector 916 (not shown in FIG. 11) is similar to the first threshold detector 910 shown in FIG. 11. It has a counterpart to NMOS transistor $Q_2$ of the first threshold detector 910, with the gate of the counterpart transistor connected to the output 906 of the peak detector 904. The second threshold detector 916 also has its counterpart to the current mirror, which in the first threshold detector 910 consists of NMOS transistors $Q_7$ and $Q_8$, and reference current source 1126. The counterpart to the current source 1126 of the second threshold detector 916 would produce a reference current that represents the noise floor threshold limit. In the present example, the counterpart to the current source 1126 generates 55 microamperes.

Figure 12:
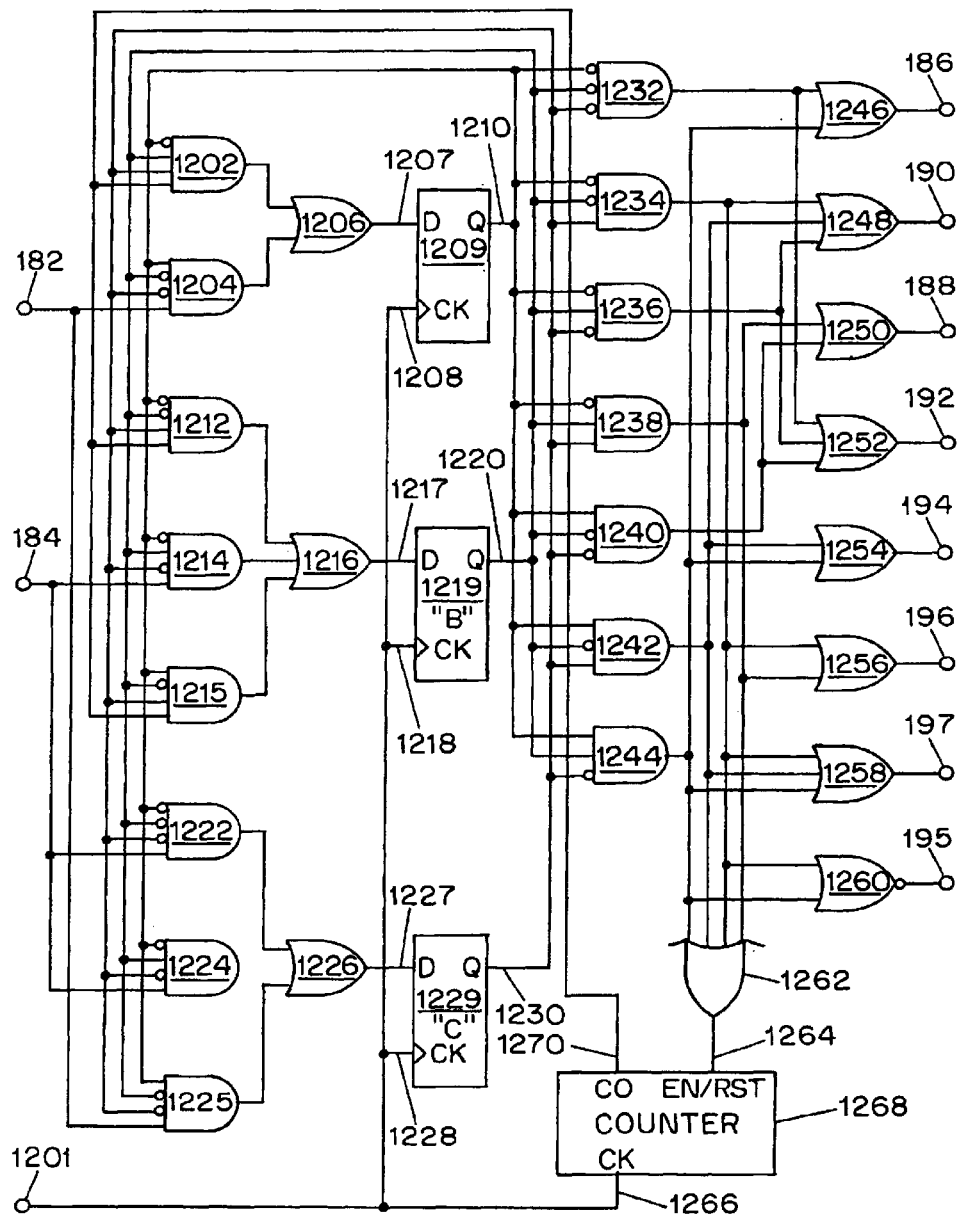
FIG. 12 is a circuit diagram illustrating a gain control unit in accordance with the present invention.

FIG. 12 illustrates an exemplary embodiment of the gain control unit 180 of the block diagram of FIG. 2 in more detail. The gain control unit 180 controls the gain of the auxiliary filter input gain unit 106, the auxiliary filter output gain unit 118, the main filter input gain unit 126, and the main filter output gain unit 138. The gain control unit 180 is implemented with AND gates, OR gates, a positive edge triggered D-type flip flop 1209, a positive edge triggered D-type flip flop 1219, a positive edge triggered D-type flip flop 1229 and an N-bit counter 1268. The gain control unit 180 receives control signals at inputs 164, 166, which are applied to an array of AND gates, and a clock signal at the input 1201, which is conveyed to clock inputs 1208, 1218 and 1228 of the positive edge triggered D-type flip flops 1209, 1219 and 1229, respectively, and clock input 1266 of the N-bit counter 1268.

The N-bit counter 1268 receives a signal at an enable/reset input 1264, and a signal at a clock input 1266, and provides an output at the counter overflow output 1270. If the signal received at the input 1264 is a logical one, the N-bit counter 1268 increments on the positive edge of each clock cycle, and the signal produced at the counter overflow output 1270 is a logical zero, until it gets to a specified maximum value. On the clock cycle after the N-bit counter 1268 reaches its specified maximum value, the signal produced at the counter overflow output 1270 is a logical one.

If the signal received at the input 1264 is a logical zero, the N-bit counter 1268 is reset to a predetermined state, and the signal produced at the counter overflow output 1270 is a logical zero. In the exemplary embodiment, the predetermined state is selected such that once the signal received at the enable/reset input 1264 changes from a logical zero to a logical one, the counter overflow output 1270 will not change to a logical one until a time required for the largest possible transient on the outpost of the main filter die out has passed.

A four input AND gate 1202 receives the inverse of a signal from the data output 1210 of the positive edge triggered D-type flip flop 1209, a signal from the data output 1220 of the positive edge triggered D-type flip flop 1219, a signal from the data output 1230 of the positive edge triggered D-type flip flop 1229 and a signal from the counter overflow output 1270 of the counter 1268. The output of the four input AND gate 1202 is provided to a one input of a two input OR gate 1206. A four input AND gate 1204 receives a signal from a data output 1210 of the positive edge triggered D-type flip flop 1209, the inverse of a signal from the data output 1220 of the positive edge triggered D-type flip flop 1219, the inverse of a signal from the data output 1230 of the positive edge triggered D-type flip flop 1229, and a signal received by the input 164. The output of the four input AND gate 1204 is provided to its other input of the two input OR gate 1206. The output of the two input OR gate 1206 is provided to the data input 1207 of the positive edge triggered D-type flip flop 1209.

A four input AND gate 1212 receives the inverse of a signal from a data output 1210 of the positive edge triggered D-type flip flop 1209, the inverse of a signal from the data output 1220 of the positive edge triggered D-type flip flop 1219, a signal from the data output 1230 of the positive edge triggered D-type flip flop 1229, and a signal from the counter overflow output 1270 of the counter 1268. The output of the four input AND gate 1212 is provided to one input of a three input OR gate 1216. A four input AND gate 1214 receives the inverse of a signal from a data output 1210 of the positive edge triggered D-type flip flop 1209, a signal from the data output 1220 of the positive edge triggered D-type flip flop 1219, the inverse of a signal from the data output 1230 of the positive edge triggered D-type flip flop 1229 and a signal received by the input 166. The output of the four input AND gate 1214 is provided to another input of the three input OR gate 1216. A four input AND gate 1215 receives a signal from a data output 1210 of the positive edge triggered D-type flip flop 1209, the inverse of a signal from the data output 1220 of the positive edge triggered D-type flip flop 1219, a signal from the data output 1230 of the positive edge triggered D-type flip flop 1229, and a signal from the counter overflow output 1270 of the counter 1268. The output of the four input AND gate 1215 is provided to the remaining input of the three input OR gate 1216. The three input OR gate 1216 provides its output to the data input 1217 of the positive edge triggered D-type flip flop 1219.

A four input AND gate 1222 receives the inverse of a signal from a data output 1210 of the positive edge triggered D-type flip flop 1209, the inverse of a signal from the data output 1220 of the positive edge triggered D-type flip flop 1219, the inverse of a signal from the data output 1230 of the positive edge triggered D-type flip flop 1229, and a signal received by the input 166. The output of the four input AND gate 1222 is provided to one input of a three input OR gate 1226. A four input AND gate 1224 receives the inverse of a signal from a data output 1210 of the positive edge triggered D-type flip flop 1209, a signal from the data output 1220 of the positive edge triggered D-type flip flop 1219, the inverse of a signal from the data output 1230 of the positive edge triggered D-type flip flop 1229, and a signal received by the input 166. The output of the four input AND gate 1224 is provided to another input of the three input OR gate 1226. A four input AND gate 1225 receives a signal from a data output 1210 of the positive edge triggered D-type flip flop 1209, the inverse of a signal from the data output 1220 of the positive edge triggered D-type flip flop 1219, the inverse of a signal from the data output 1230 of the positive edge triggered D-type flip flop 1229, and a signal received by the input 164. The output of the four input AND gate 1225 is provided to the remaining input of the three input OR gate 1226. The three input OR gate 1226 provides its output to the data input 1227 of the positive edge triggered D-type flip flop 1229.

The first D-type flip-flop 1209 holds the most significant bit of the current state of the gain control unit 180 until the next positive edge of the clock signal received at the clock input 1201 of the gain control unit 180, at which time the most significant bit of the current state is provided at the output 1210 of flip-flop 1209. The second D-type flip-flop 1219 holds the second most significant bit of the current state of the gain control unit 180 until the next positive edge of the clock signal received at the clock input 1201 of the gain control unit 180, at which time the second most significant bit of the current state is provided at the output 1220 of flip-flop 1219. The third D-type flip-flop 1229 holds the least significant bit of the current state of the gain control unit 180 until the next positive edge of the clock signal received at the clock input 1201 of the gain control unit 180, at which time the least significant bit of the current state is provided at the output 1230 of flip-flop 1229.

A three input AND gate 1232 receives the inverse of a signal from the data output 1210 of the positive edge triggered D-type flip flop 1209, the inverse of a signal from the data output 1220 of the positive edge triggered D-type flip flop 1219, and the inverse of a signal from the data output 1230 of the positive edge triggered D-type flip flop 1229. The output of the three input AND gate 1232 is provided to one respective input of a two input OR gate 1246 and to one input of a three input OR gate 1252. A three input AND gate 1234 receives the inverse of a signal from the data output 1210 of the positive edge triggered D-type flip flop 1209, the inverse of a signal from the data output 1220 of the positive edge triggered D-type flip flop 1219 and a signal from the data output 1230 of the positive edge triggered D-type flip flop 1229. The output of the three input AND gate 1234 is provided to one respective input of a three input OR gate 1248 one input of a two input OR gate 1256, one input of a two input OR gate 1258, one input of a two input NOR gate 1260 and a first input of a four input OR gate 1262. A three input AND gate 1236 receives the inverse of a signal from the data output 1210 of the positive edge triggered D-type flip flop 1209, a signal from the data output 1220 of the positive edge triggered D-type flip flop 1219 and the inverse of a signal from the data output 1230 of the positive edge triggered D-type flip flop 1229. The output of the three input AND gate 1236 is provided to another input of the three input OR gate 1248, and another input of the three input OR gate 1252. A three input AND gate 1238 receives the inverse of a signal from the data output 1210 of the positive edge triggered D-type flip flop 1209, a signal from the data output 1220 of the positive edge triggered D-type flip flop 1219 and a signal from the data output 1230 of the positive edge triggered D-type flip flop 1229. The output of the three input AND gate 1238 is provided to one input of a two input OR gate 1250, the other input of the two input OR gate 1256 and a second input of the four input OR gate 1262. A three input AND gate 1240 receives a signal from the data output 1210 of the positive edge triggered D-type flip flop 1209, the inverse of a signal from the data output 1220 of the positive edge triggered D-type flip flop 1219, and the inverse of a signal from the data output 1230 of the positive edge triggered D-type flip flop 1229. The output of the three input AND gate 1240 is provided to the other input of the two input OR gate 1250 and the remaining input of the three input OR gate 1252. A three input AND gate 1242 receives a signal from the data output 1210 of the positive edge triggered D-type flip flop 1209, the inverse of a signal from the data output 1220 of the positive edge triggered D-type flip flop 1219 and a signal from the data output 1230 of the positive edge triggered D-type flip flop 1229, the output of the three input AND gate 1242 is provided to the remaining input of the three input OR gate 1248, one input of a two input OR gate 1254 and a third input of the four input OR gate 1262. A three input AND gate 1244 receives a signal from the data output 1210 of the positive edge triggered D-type flip flop 1209, a signal from the data output 1220 of the positive edge triggered D-type flip flop 1219 and the inverse of a signal from the data output 1230 of the positive edge triggered D-type flip flop 1229. The output of the three input AND gate 1244 is provided to the other input of the two input OR gate 1246, the other input of the two input OR gate 1254, the other input of the two input OR gate 1258, the other input of the two input NOR gate 1260 and a fourth input of the four input OR gate 1262.

The two input OR gate 1246 provides its output to an output terminal 186 The three input OR gate 1248 provides its output to output terminal 190. The two input OR gate 1250 provides its output to output terminal 188. The three input OR gate 1252 provides its output to output terminal 192. The two input OR gate 1254 provides its output to output terminal 194. The two input OR gate 1256 provides its output to output terminal 196. The two input OR gate 1258 provides its output to output terminal 197. The two input NOR gate 1260 provides its output to output terminal 195. The four input OR gate 1262 provides its output to the input 1264 of the counter 1268.

Figure 13:
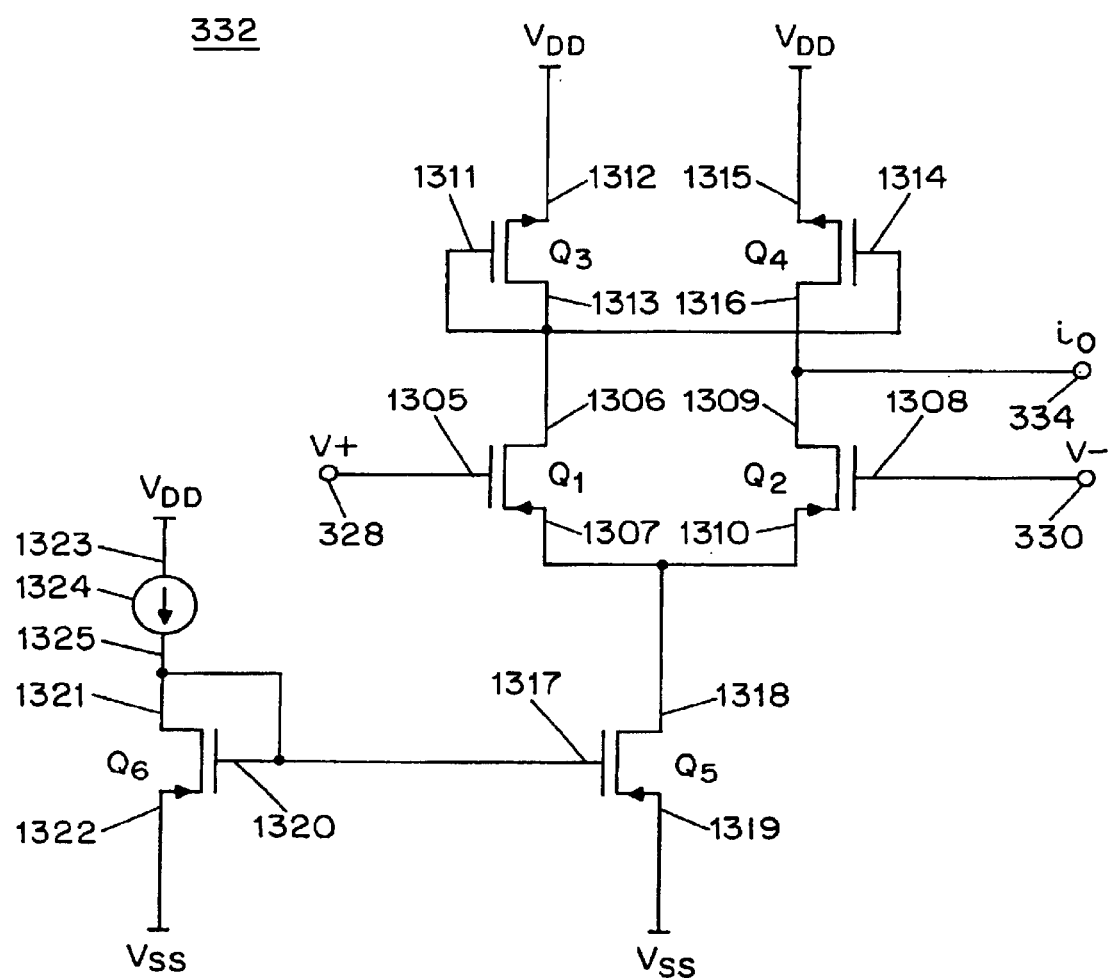
FIG. 13 is a circuit diagram illustrating a transconductor in accordance with the present invention.

FIG. 13 illustrates an exemplary embodiment of the transconductor 332 in the main filter input gain unit 126 depicted in FIG. 3 in greater detail. The transconductors 412, 420, 428 and 442 used in the Tow-Thomas biquad 132 depicted in FIG. 4, and 1042 used in peak detection 904 depicted in FIG. 10 are similar in construction. The transconductor 332 includes an NMOS transistor $Q_1$, an NMOS transistor $Q_2$, a PMOS transistor $Q_3$, a PMOS transistor $Q_4$, an NMOS transistor $Q_5$, an NMOS transistor $Q_6$, and a current source 1324.

A signal received by the positive input 328 of the transconductor 332 is applied to the gate 1305 of the NMOS transistor $Q_1$. The NMOS transistor $Q_1$ allows current to flow from its source 1307 to its drain 1306, or vice versa, depending on the signal at the gate 1305 and the relative voltages at its source 1307 and at its drain 1306. The drain 1306 of the NMOS transistor $Q_1$ is connected to the drain 1313 and the gate 1311 of the PMOS transistor $Q_3$, and the gate 1314 of the PMOS transistor $Q_4$. The source 1307 of the NMOS transistor $Q_1$ is connected to the drain 1318 of the NMOS transistor $Q_5$ and the source 1310 of the NMOS transistor $Q_2$.

A signal-received by the negative input 330 of the transconductor 332 is applied to the gate 1308 of the NMOS transistor $Q_2$. The drain 1309 of the NMOS transistor $Q_2$ is connected to the drain 1316 of the PMOS transistor $Q_4$ and the output 334 of the transconductor 332. The source 1310 of the NMOS transistor $Q_2$ is connected to the drain 1318 of the NMOS transistor $Q_5$, and the source 1307 of the NMOS transistor $Q_1$.

The drain 1313 of the PMOS transistor $Q_3$ is connected to the drain 1306 of the NMOS transistor $Q_1$, the gate 1311 of the PMOS transistor $Q_3$, and the gate 1314 of the PMOS transistor $Q_4$. The source 1312 of the PMOS transistor $Q_3$ is connected to supply voltage $V_{dd}$.

The source 1315 of the PMOS transistor $Q_4$ is connected to supply voltage $V_{dd}$.

The drain 1318 of the NMOS transistor $Q_5$ is connected to the source 1307 of the NMOS transistor $Q_1$ and the source 1310 of the NMOS transistor $Q_2$. The source 1319 of the NMOS transistor $Q_5$ is connected to supply voltage $V_{ss}$. The gate 1317 of the NMOS transistor $Q_5$ is connected to the gate 1320 and the drain 1321 of the NMOS transistor $Q_6$, and the negative terminal 1325 of the current source 1324.

The source 1322 of the NMOS transistor $Q_6$ is connected to supply voltage $V_{ss}$.

The current source 1324 produces a bias current $I_{bias}$ for the transconductor 332. The bias current $I_{bias}$ produced by the current source 1324 controls the center frequency of the filter. The bias current $I_{bias}$ of the transconductor 332 is adjusted to give a stable center frequency in the presence of fabrication tolerances and temperature variations. The bias current $I_{bias}$ can be any value, for example 100 microamperes, and the transistors $Q_1$, $Q_2$, $Q_3$, $Q_4$, $Q_5$, $Q_6$ of the transconductor 332 are scaled to yield the desired transconductances. The transconductance for the transconductors is calculated using the equation:

$$G_m = I_{tail}/(V_{GS}-V_T), \quad (3)$$

where $I_{tail}$ is the current passing through the transistor $Q_5$, $V_T$ is the threshold voltage of transistors $Q_5$ and $Q_6$, and $V_{GS}$ is the gate-source voltage of the transistors $Q_5$, $Q_6$. The linear range of the transconductor is related to the quantity $V_{GS}-V_T$. Once the bias current $I_{bias}$ has been set, the transistors $Q_5$, $Q_6$ are scaled such that, the following equation is satisfied:

$$(W_{Q5}/L_{Q5})/(W_{Q6}/L_{Q6}) = I_{tail}/I_{bias}, \quad (4)$$

where $W_{Q5}$ and $L_{Q5}$ are the width and length of the channel of NMOS transistor $Q_5$, respectively, and $W_{Q6}$ and $L_{Q6}$ are the width and length of the channel of NMOS transistor $Q_6$, respectively. The positive terminal of the current source 1324 is connected to supply voltage $V_{dd}$. The preferred form of the current source 1324 is a resistor connected to the between the supply voltage $V_{dd}$ and the drain 1321 and the gate 1320 of the NMOS transistor $Q_6$. Each transconductor of the signal processing system 100 may have the configuration of the transconductor 332.

Referring to FIG. 14, there is shown an exemplary on/off transconductor 342. The on/off transconductor 342 is identical to the transconductor 332 shown in FIG. 13, except for the addition of a PMOS transistor $Q_7$ and an NMOS transistor $Q_8$. The PMOS transistor $Q_7$ is connected between the gate 1317 of the NMOS transistor $Q_5$ and ground. The NMOS transistor $Q_8$ connected in series between the gate 1320 of the NMOS transistor $Q_6$ and the gate 1317 of the NMOS transistor $Q_5$. The gate 1404 of NMOS transistor $Q_8$ and the gate 1405 of the PMOS transistor are both connected to the on/off input 340 of the on/off transconductor 342. If the PMOS transistor $Q_7$ is turned off and the NMOS transistor $Q_8$ is turned on by the application of a logical one voltage level to their respective gate terminals 1404 and 1405 via the on/off input 340, the on/off transconductor 342 operates in essentially the same manner as the transconductor 332 shown in FIG. 13. However, if the PMOS transistor $Q_7$ is turned on and the NMOS transistor $Q_8$ is turned off by the application of a logical zero voltage to the gate terminal 1404, the on/off transconductor 342 is disabled and the output 344 of the on/off transconductor 342 acts as an open circuit.

Figure 15:
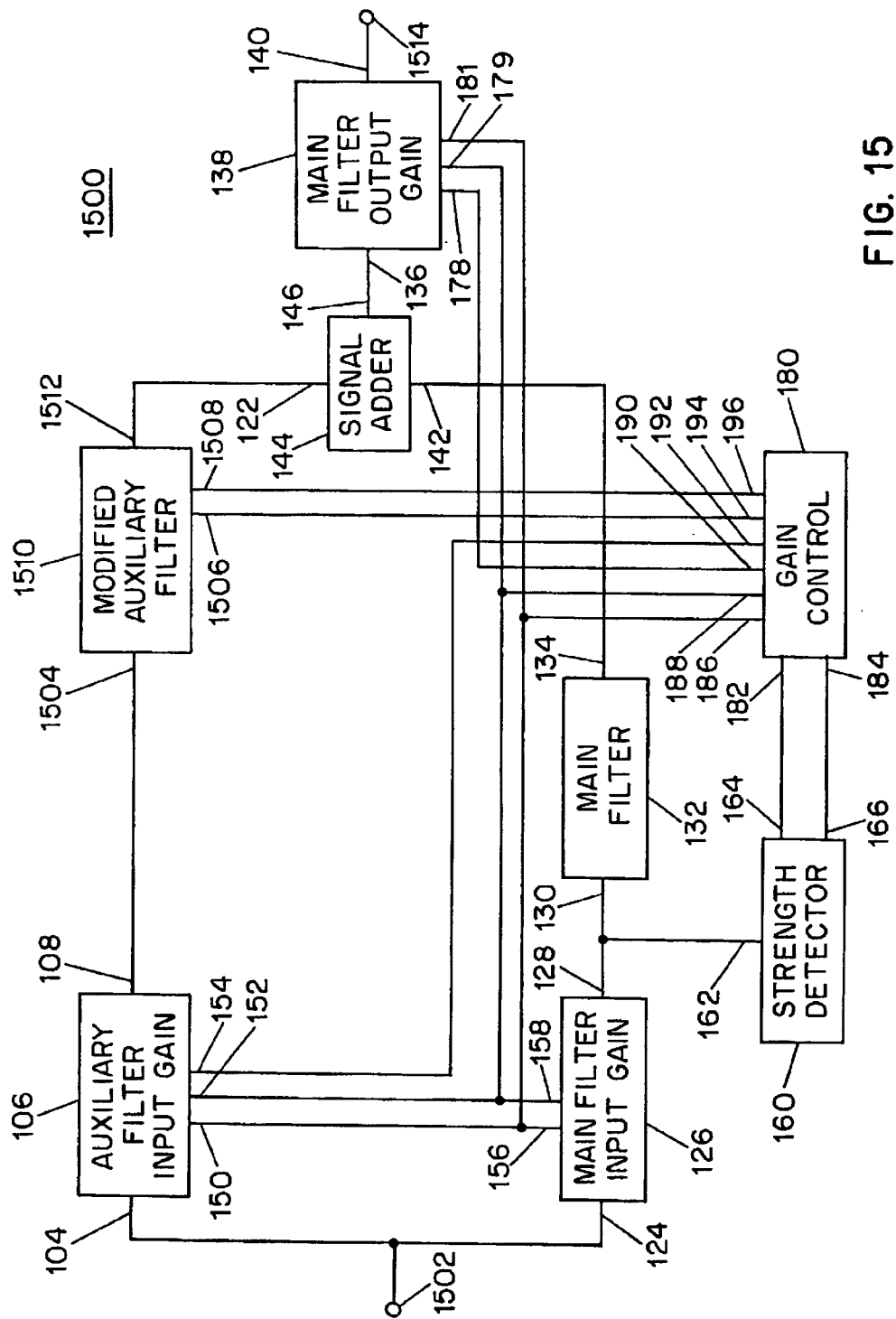
FIG. 15 is a block diagram illustrating a signal processing system in accordance with the present invention.

Referring now to FIG. 2, if the successive amplification factors of the main filter input gain unit 126, the main filter output gain unit 138, the auxiliary filter input gain unit 106, and the auxiliary filter output gain unit 118 of the signal processing system have a constant ratio to one another (i.e. if the main filter input gain unit 106 has amplification factors of 10, 1 and 1/10), the signal processing system 100 may be simplified. Signal processing system 1500 shown in FIG. 15 is one such system. In the signal processing system 100 of FIG. 2 the auxiliary filter output gain unit 118 amplifies a signal produced by the auxiliary filter 112 and produces an output signal which is combined with the signal produced by the main filter output gain unit 138 which amplifies a signal produced by the main filter 132. If the successive amplification factors have a constant ratio, the signals produced by the main filter 132 and the auxiliary filter 112 are amplified by common factors and the signal from the auxiliary filter 112 is scaled by some additional factors. In the signal processing system 1500 of FIG. 15, the signals produced by the modified auxiliary filter 1510 and the main filter 132 are amplified by the main filter output gain unit 138, and the modified auxiliary filter 1510 internally amplifies the processed signal by various amplification factors. The main filter output gain unit 138 is moved from its location in the signal processing system 100 from between the main filter 132 and the signal adder 144, as shown in FIG. 2, to between the signal adder 144 and the system output 1514, as shown in FIG. 15. Moving the main filter output gain unit 138 causes it to amplify the signal produced by the modified auxiliary filter 1510 and the signal produced by the main filter 132. This simplified signal processing system 1500 is illustrated in FIG. 15.

Referring to FIG. 15, the signal processing system 1500 includes a system input 1502, a main filter input gain unit 126, a main filter 132, a main filter output gain unit 138, an auxiliary filter input gain unit 106, a modified auxiliary filter 1510, a signal adder 144, a system output 1514, a strength detector 160, and a gain control unit 180. The signal processing system 1500 generates a processed signal provided to the system output 1514 with a strong in channel component well above the filter noise, which is not disturbed when internal states of the signal processing system 1500 are changed. The signal processing system 1500 accomplishes this in a manner similar to the signal processing system 100. The signal processing system 1500 combines a signal processed by the modified auxiliary filter 1510 and a signal processed by the main filter 132 whenever there is a change in an amplification factor of the main filter input gain unit 126 and a change in an amplification factor of the main filter output gain unit 138. The signal processed by the modified auxiliary filter 1510 is combined with the signal processed by the main filter 132 for a period of time at least as long as the amount of time it takes for transients in the signal processed by the main filter 132 to die out. The transients in the signal processed by the modified auxiliary filter 1510 offset the transients in the signal processed by the main filter 132. Therefore by combining the signal produced by the modified auxiliary filter 1510 with the signal produced by the main filter 132, transients in the signal at the system output 1514 of the signal processing system 1500 are avoided when the amplification factor of the main filter input gain unit 126 and the amplification factor of the main filter output gain unit 138 are changed.

A signal received at system input 1502 is applied to an input 124 of the main filter input gain unit 126, as described above in relation to FIGS. 2 and 3, and an input 104 of the auxiliary filter input gain unit 106, described above in relation to FIGS. 2 and 6. The output 128 of the main filter input gain unit 126 is coupled to an input 130 of the main filter 132, as described above in relation to FIGS. 2 and 4, and an input 162 of the strength detector 160, as described above in relation to FIGS. 2, 9, 10 and 11. The output 134 of the main filter 132 is connected to the input 142 of the signal adder 144, as described above in relation to FIGS. 2 and 8.

The output 108 of the auxiliary filter input gain unit 106 is connected to an input 1504 of the modified auxiliary filter 1510. The modified auxiliary filter 1510 incorporates the functionality of the auxiliary filter 112 and some of the functionality of the auxiliary filter output gain unit 118. The modified auxiliary filter 1510 processes the signal in the same manner as the auxiliary filter 112, described above with reference to FIGS. 2 and 4, and it amplifies the processed signal by one of two amplification factors. The modified auxiliary filter 1510 will be discussed in more detail below with reference to FIG. 16. An output 1512 of the modified auxiliary filter 1510 is connected to the input 122 of the signal adder 144, as described above in relation to FIGS. 2 and 8. The output 146 of the signal adder 144 is connected to the input 136 of the main filter output gain unit 138, as described above in relation to FIGS. 2 and 5. The output 140 of the main filter output gain unit 138 is connected to the system output 1514.

The outputs 164, 166 of the strength detector 160 are connected to the inputs 182, 184, respectively, of the gain control unit 180, as described above in relation to FIGS. 2 and 12. The outputs 186, 188 of the gain control unit 180 are connected to the inputs 156, 158, respectively, of the main filter input gain unit 126. The outputs 186, 188, 192 of the gain control unit 180 are connected to the inputs 150, 152, 154, respectively, of the auxiliary filter input gain unit 106. The outputs 194, 196 of the gain control unit 180 are connected to the inputs 1506, 1508, respectively, of the modified auxiliary filter 1510. And the outputs 186, 188, 190 of the gain control unit 180 are connected to the inputs 181, 179, 178, respectively, of the main filter output gain unit 138.

Figure 16:
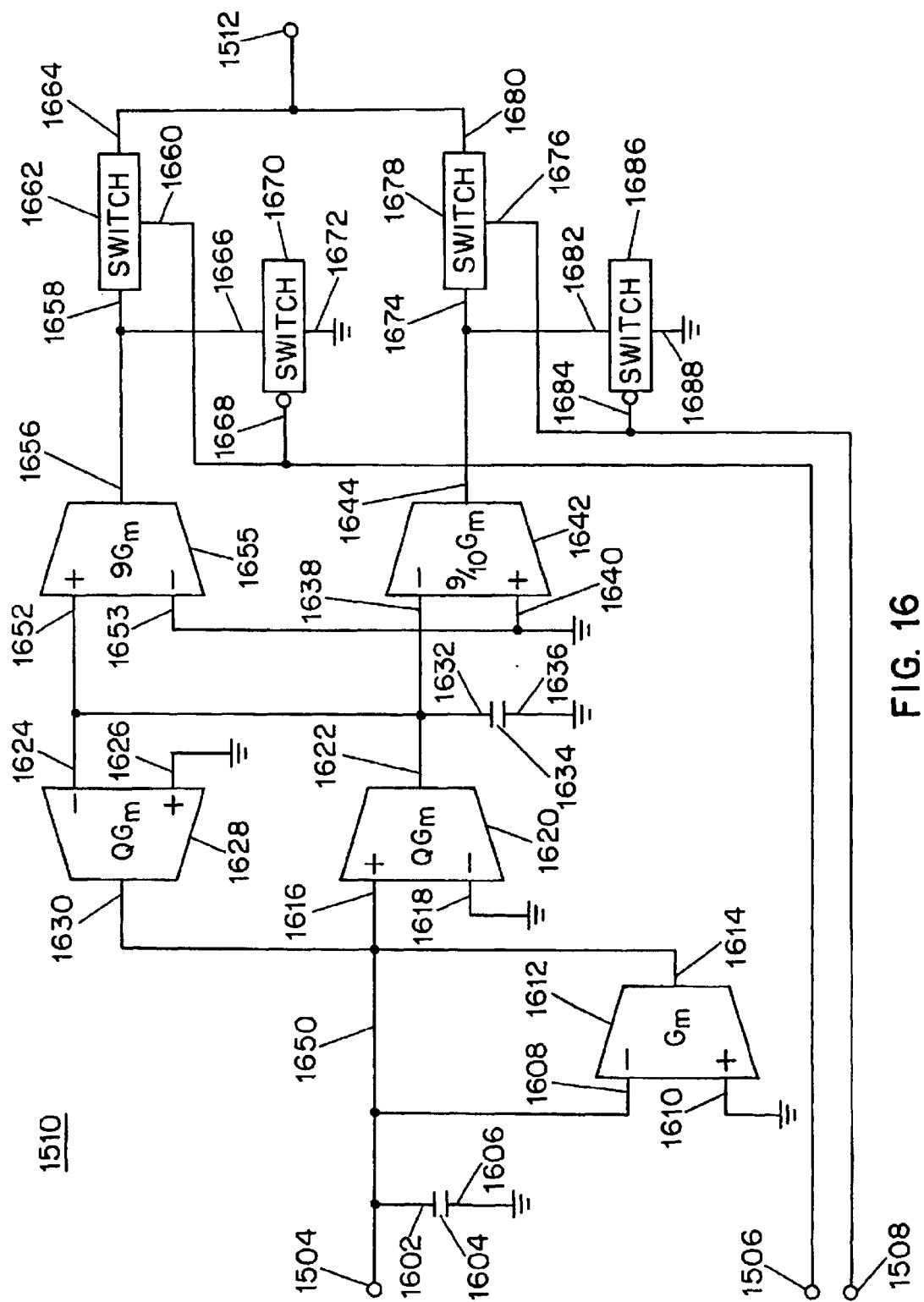
FIG. 16 is a circuit diagram illustrating a modified auxiliary filter in accordance with the present invention.

FIG. 16 illustrates an exemplary embodiment of the modified auxiliary filter 1510 which is in the form of a modified standard Tow-Thomas biquad. The standard Tow-Thomas biquad is modified to incorporate output amplification. The modified auxiliary filter 1510 includes an input 1504, a gain control input 1506, a gain control input 1508, a signal output 1512, a transconductor 1612, a transconductor 1620, a transconductor 1628, a transconductor 1642, a transconductor 1655, a capacitor 1604, a capacitor 1634, a switch 1662, a switch 1670, a switch 1678, and a switch 1686. Switches 1662, 1670, 1678 and 1686 may be implemented as CMOS transmission gates. The center frequency coo of the modified auxiliary filter 1510 can be calculated by the equation:

$$\omega_0 = QG_m/C \tag{1}$$

where Q is the quality factor of the modified auxiliary filter 1510 and $G_m$ is the transconductance of transconductor 1612. The absolute values of the transconductances and capacitances of the modified auxiliary filter 1310 can be scaled by the same factor, i.e., impedance scaling, without affecting the transfer function of the modified auxiliary filter 1510, since the transfer function depends on the ratios of these values. Impedance scaling does not change the transfer function of the modified auxiliary filter 1510; however, it does change the power dissipation and the noise level of the modified auxiliary filter 1510. In addition to filtering the signal received at the input 1504, the modified auxiliary filter 1510 amplifies the signal according to the signals received at the inputs 1506, 1508. If the input 1506 receives a logical zero voltage level signal and the input 1508 receives a logical zero voltage level signal, which cause switches 1662 and 1672 to both open, and switches 1670 and 1686 to both close, the output 1512 of the auxiliary filter is an open circuit, and therefore the modified auxiliary filter 1510 does not contribute anything to the output signal produced at the system output 1514. If the input 1506 receives a logical one voltage level signal and the input 1508 receives a logical zero voltage level signal, which causes switches 1662 and 1686 to both close and, switches 1678 and 1670 to both open, the output signal is amplified by 9 $G_m$. If the input 1506 receives a logical zero voltage level signal and the input 1508 receives a logical one voltage level signal, which causes switches 1662 and 1686 to both open, and switches 1678 and 1670 to both close, the output signal is amplified by −9/10 $G_m$. The inputs 1506 and 1508 should not both receive logical one voltage level signals at the same time.

A signal received by the input 1504 of the modified auxiliary filter 1510 is applied to a terminal 1602 of the capacitor 1604, a negative input 1608 of the transconductor 1612, an output 1614 of the transconductor 1612, a positive input 1616 of the transconductor 1620, and an output 1630 of the transconductor 1628. These connections form a node 1650. The other terminal 1606 of the capacitor 1604 is connected to ground. The capacitor 1604 integrates the current signals provided to node 1650 by the outputs of transconductors 1612 and 1628.

The transconductor 1612 operates on the difference between the voltage signal received at a positive input 1610, which is connected to ground, and the voltage signal received at the negative input 1608, and provides a current signal at its output 1614. The signal at the current output 1614 of the transconductor 1612 is equal to the difference between the voltage signal received by its positive input 1610, which is connected to ground, and the signal received by its negative input 1608, which is the voltage at terminal 1602 of the capacitor 1604, scaled by its transconductance $G_m$. As explained above, the output 1614 of the transconductor 1612 together with one terminal 1602 of the capacitor 1604, the negative input 1608 of the transconductor 1612, the input 1504, the positive input 1616 of the transconductor 1620 and the output 1630 of the transconductor 1628 form node 1650. The transconductor 1612 forms a feedback loop at at the node 1650.

The transconductor 1620 operates on the difference between the voltage signal received at its positive input 1616, which is the voltage at terminal 1602 of the capacitor 1604, and the voltage signal received at its negative input 1618, which is connected to ground, and provides a current signal at its output 1622. The current signal at the output 1622 is equal to the difference between the voltage signal received by the positive input 1616, which is node 1650, and the voltage signal received by the negative input 1618, scaled by a transconductance $QG_m$. The output 1622 of the transconductor 1620 together with one terminal 1632 of a capacitor 1634, a positive input 1638 of the transconductor 1642, the positive input 1652 of the transconductor 1655 and a negative input 1624 of the transconductor 1628 form node 1651. The other terminal 1636 of the capacitor 1634 is connected to ground. The capacitor 1634 integrates the current provided to node 1651 by the output 1622 of transconductor 1620.

The transconductor 1628 operates on the difference between the voltage signal received at its positive input 1626, which is connected to ground and the voltage signal received at its negative input 1624, which is voltage at terminal 1632 of the capacitor 1634, and provides a signal at its output 1630 which is connected to node 1650. The current signal at the output 1630, which is connected to node 1650, is equal to the difference in the signal received by the positive input 1626 and the signal received by the negative input 1624, which is connected to node 1651, of the transconductor 1628, scaled by a transconductance $QG_m$.

The transconductor 1642 operates on the difference between the positive input 1640, which is connected to ground, and the signal received at its negative input 1638, which is the voltage at terminal 1632 of the capacitor 1634, and provides a current signal at an output 1644. The signal at the output 1644 is equal to the difference between the voltage signal received by the positive input 1638, which is node 1651, and the signal received by the negative input 1640 of the transconductor 1642, scaled by a transconductance 9/10 $G_m$. The output 1644 of the transconductor 1642 is coupled to a signal input 1674 of the switch 1678 and a terminal 1682 of the switch 1686. A signal output 1680 of the switch 1678 is connected to the signal output 1512. A terminal 1688 of the switch 1686 is connected to ground. The switch control terminal 1676 of the switch 1678 and the inverted switch control terminal 684 of the switch 1686 are connected to the input 1508. If the input 1508 receives a logical one voltage level signal, the switch 1678 connects its signal input 1674 and its signal output 1680, which connects the output 1644 of the transconductor 1642 to the output 1512, and the switch 1686 disconnects its terminal 1682 from its terminal 1688. If the input 1508 receives a logical zero voltage level signal, the switch 1678 disconnects its signal input 1674 and its signal output 1680, and the switch 1686 connects its terminal 1682 to its terminal 1688, which connects the output 1644 of the transconductor 1642 to ground.

The transconductor 1655 operates on the difference between the positive input 1652, which is the voltage at terminal 1632 of the capacitor 1634, and the signal received at its negative input 1653, which is connected to ground, and provides a current signal at an output 1656. The signal at the output 1656 is equal to the difference between the voltage signal received by the positive input 1652, which is node 1651, and the signal received by the negative input 1653 of the transconductor 1655, scaled by a transconductance 9 $G_m$. The output 1656 of the transconductor 1655 is coupled to a signal input 1658 of the switch 1662 and a terminal 1666 of the switch 1670. A signal output 1664 of the switch 1662 is connected to the signal output 1512. A terminal 1672 of the switch 1670 is connected to ground. The switch control terminal 1660 of the switch 1662 and the inverted switch control terminal 1668 of the switch 1670 are connected to the input 1506. If the input 1506 receives a logical one voltage level signal, the switch 1662 connects its signal input 1658 and its signal output 1664, which connects the output 1656 of the transconductor 1655 to the output 1512, and the switch 1670 disconnects its terminal 1666 from its terminal 1672. If the input 1506 receives a logical zero voltage level signal, the switch 1662 disconnects its signal input 1658 and its signal output 1664, and the switch 1670 connects its terminal 1666 and its terminal 1672, which connects the output 1656 of the transconductor 1655 to ground.

In an exemplary embodiment of the modified auxiliary filter 1510, the capacitance of the capacitors 1604 and 1634 are each 80 v|. the quality factor, Q, is 20, and the transconductance $G_m$ is 50.

In another exemplary embodiment of the modified auxiliary filter 1510, a first diode (not shown) and a second diode (not shown) are connected to the node 1650. The cathode of the first diode is connected to the node 1650 and an anode of the first diode is connected to ground. The anode of the second diode is connected to the node 1650 and a cathode of the second diode is connected to ground. This arrangement limits the voltage swing at the node 1650 to approximately ±0.7 volts.

In still another exemplary embodiment of the modified auxiliary filter 1510, a first diode (not shown) and a second diode (not shown) are connected to the input 1504. The cathode of the first diode is connected to the input 1504 and an anode of the first diode is connected to ground. The anode of the second diode is connected to the input 1504 and a cathode of the second diode is connected to ground. This arrangement limits the voltage swing at the input 1504 to approximately ±0.7 volts.

In yet another exemplary embodiment of the modified auxiliary filter 1510, a first diode (not shown) and a second diode (not shown) are connected to the output 1510. The cathode of the first diode is connected to the output 1510 and an anode of the first diode is connected to ground. The anode of the second diode is connected to the output 1510 and a cathode of the second diode is connected to ground. This arrangement limits the voltage swing at the output 134 to approximately ±0.7 volts.

Figure 17:
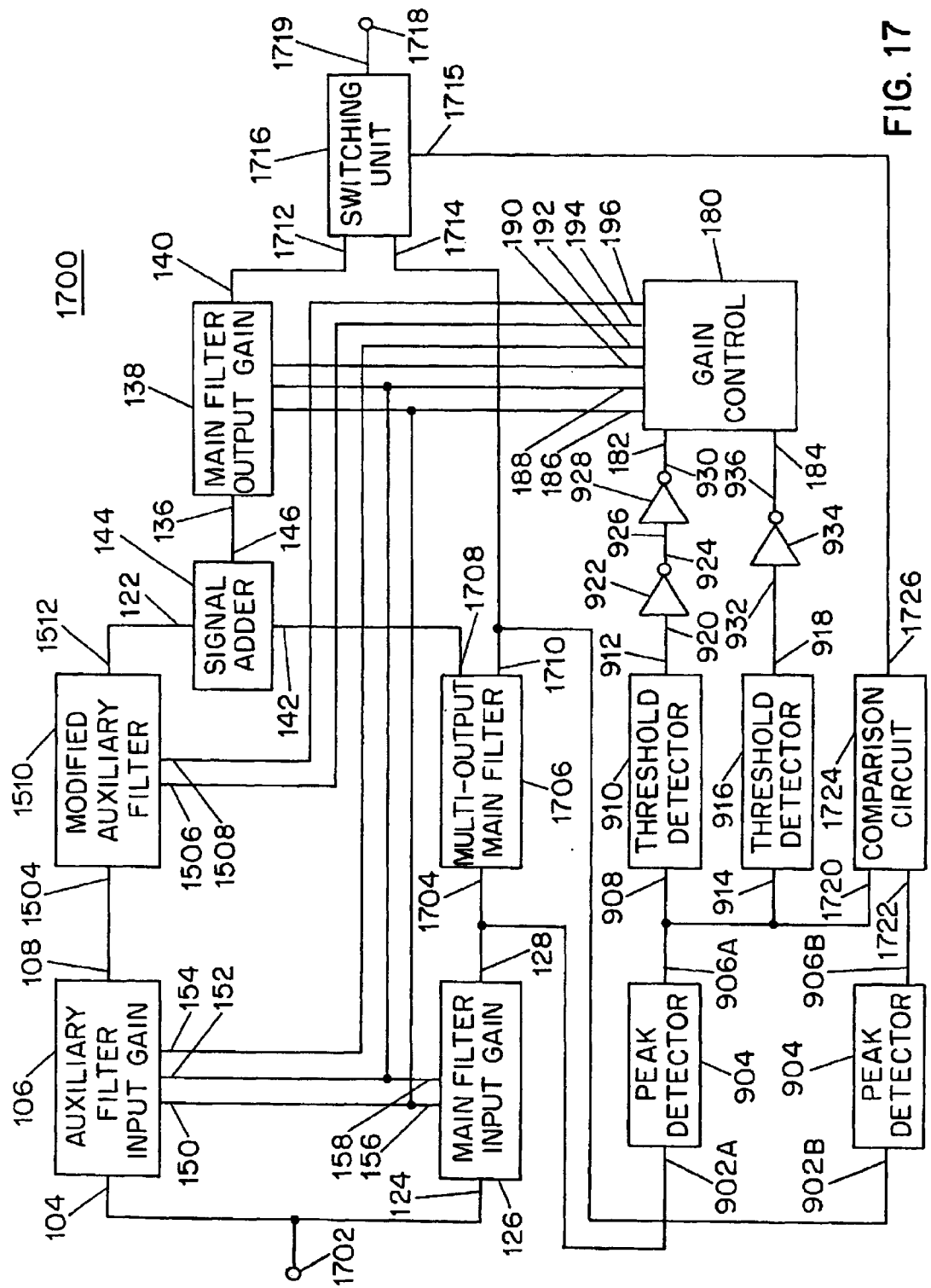
FIG. 17 is a block diagram illustrating a signal processing system in accordance with the present invention.

FIG. 17 illustrates a signal processing system 1700. If the signal processing system 1500, shown in FIG. 15, processes a signal with an out-band component which is large as compared to the in-band component it may be desirable to take the output of the main filter output gain unit 138 as the system output, however, if the signal processing system 1500 processes a signal with an out-band component which is not large as compared to the in-band component of the signal it may be desirable to take the system output from another location. The signal processing system 1700 is configured to take the output of the main filter output gain unit 138 as the system output 1718 when the signal received at the input 1702 has a large out-band component relative to the in-band component, and take the system output from another location, here an output 1710 of a multi-output main filter 1708, if the signal received at the input 1702 does not have a large out-band component relative to the in-band component. In the present embodiment, the out-band component is large compared to the in-band component of the signal received at the input 1702 if the voltage envelope of the signal received at an input 1704 of the multi-output main filter 1706 is at least 10 dB greater than the voltage envelope of the signal produced at the output 1710 of the multi-output main filter 1706.

The signal processing system 1700 includes a system input 1702, a main filter input gain unit 126, a multi-output main filter 1706, a main filter output gain unit 138, an auxiliary filter input gain unit 106, a modified auxiliary filter 1510, a signal adder 144, a switching unit 1716, a system output 1718, a first peak detector 904, a second peak detector 904, a threshold detector 910, a threshold detector 916, an inverter 922, an inverter 928, an inverter 934, a comparison circuit 1724, and a gain control unit 180. The signal processing system 1700 generates a processed signal provided to the system output 1718 with a strong in channel component well above the filter noise, which is not disturbed when internal states of the signal processing system 1700 are changed. The signal processing system 1700 accomplishes this in a manner similar to the signal processing systems 100 and 1500 if the out-band component of the signal received at the system input 1702 is large compared to the in-band component. If the out-band component of the signal received at the system input 1702 is large compared to the in-band component, the signal processing system 1700 combines a signal processed by the modified auxiliary filter 1510 and a signal processed by the multi-output main filter 1706 whenever there is a change in an amplification factor of the main filter input gain unit 126 and an amplification factor of the main filter output gain unit 138. The signal processed by the modified auxiliary filter 1510 is combined with the signal processed by the multi-output main filter 1706 for a period of time at least as long as the amount of time it takes for transients in the signal processed by the multi-output main filter 1706 to die out. The transients in the signal processed by the modified auxiliary filter 1510 offset the transients in the signal processed by the multi-output main filter 1706. Therefore by combining the signal produced by the modified auxiliary filter 1510 with the signal produced by the multi-output main filter 1706, transients in the signal at the system output 1718 of the signal processing system 1700 are avoided when the amplification factor of the main filter input gain unit 126 and the amplification factor of the main filter output gain unit 138 are changed. If the out-band component of the signal received at the system input 1702 is not large compared to the in-band component, the signal processing system 1700 produces the output 1710 of the multi-output main filter 1706 at the system output 1718, because the transients present in the signal produced at the output 1710 of the multi-output main filter 1706 are relatively minor, and the voltage amplitude of the signal produced at the output 1710 remains large whether the signal at the system input 1702 has a large or small voltage envelope.

A signal received at system input 1702 is applied to an input 124 of the main filter input gain unit 126, as described above in relation to FIGS. 2 and 3, and an input 104 of the auxiliary filter input gain unit 106, described above in relation to FIGS. 2 and 6. The output 128 of the main filter input gain unit 126 is coupled to the input 1704 of the multi-output main filter 1706 and an input 902A of the first peak detector 904, as described above in relation to FIGS. 2, 9 and 10. An output 1708 of the multi-output main filter 1706 is connected to the input 142 of the signal adder 144, as described above in relation to FIGS. 2 and 8. An output 1710 of the multi-output main filter 1706 is connected to an input 1714 of the switching unit 1716 and an input 902B of the second peak detector 904, as described above in relation to FIGS. 2, 9 and 10.

The output 108 of the auxiliary filter input gain unit 106 is connected to an input 1504 of the modified auxiliary filter 1510, as described above in relation to FIGS. 15 and 16. An output 1512 of the modified auxiliary filter 1510 is connected to the input 122 of the signal adder 144, as described above in relation to FIGS. 2 and 8. The output 146 of the signal adder 144 is connected to the input 136 of the main filter output gain unit 138, as described above in relation to FIGS. 2 and 5. The output 140 of the main filter output gain unit 138 is connected to an input 1712 of the switching unit 1716.

The output 906B of the first peak detector 904 is connected to the input 908 of the threshold detector 910, the input 914 of the threshold detector 916, and an input 1720 of the comparison circuit 1724. The output 912 of the threshold detector 910, as described above in relation to FIGS. 2, 9 and 11, is connected to the input 920 of the inverter 922. The output 924 of the inverter 922 is connected to the input 926 of the inverter 928. The output 930 of the inverter 928 is connected to the input 182 of the gain control unit 180, as described above in relation to FIGS. 2 and 12. The output 918 of the threshold detector 916, as described above in relation to FIGS. 2, 9 and 11, is connected to the input 932 of the inverter 934. The output 936 of the inverter 934 is connected to the input 184 of the gain control unit 180, as described above in relation to FIGS. 2 and 12.

The output 906B of the second peak detector 904 is connected to an input 1722 of the comparison circuit 1724. An output 1726 of the comparison circuit 1724 is connected to a switch control terminal 1715 of the switching unit 1716. An output 1719 of the switching unit 1716 is connected to the system output 1718. If the signal received at the switch control terminal 1715 is a logical one voltage level the switching unit connects the input 1712 to the output 1719. Receiving a logical one voltage level signal at the input 1715 indicates that the voltage envelope of the signal received at the input 1704 of the multi-output main filter 1706 as determined by the first peak detector 904 is within 10 dB of the voltage envelope of the signal produced at the output 1710 of the multi-output main filter 1706 as determined by the second peak detector 904, as compared by comparison circuit 1724. If the signal received at the switch control terminal 1715 is a logical zero voltage level the switching unit connects the input 1714 to the output 1719. Receiving a logical zero voltage level signal at the input 1715 indicates that the voltage envelope of the signal received at the input 1704 of the multi-output main filter 1706, as determined by the first peak detector 904, is not within 10 dB of the voltage envelope of the signal produced at the output 1710 of the multi-output main filter 1706 as determined by the second peak detector 904, as compared by the comparison circuit 1724.

The outputs 186, 188 of the gain control unit 180 are connected to the inputs 156, 158, respectively, of the main filter input gain unit 126. The outputs 186, 188, 192 of the gain control unit 180 are connected to the inputs 150, 152, 154, respectively, of the auxiliary filter input gain unit 106. The outputs 194, 196 of the gain control unit 180 are connected to the inputs 1506, 1508, respectively, of the modified auxiliary filter 1510. And the outputs 186, 188, 190 of the gain control unit 180 are connected to the inputs 181, 179, 178, respectively, of the main filter output gain unit 138. In the signal processing system 1700, the outputs 195 and 197 of the gain control unit 180 shown in FIG. 12 are not necessary, and are therefore not connected.

Figure 18:
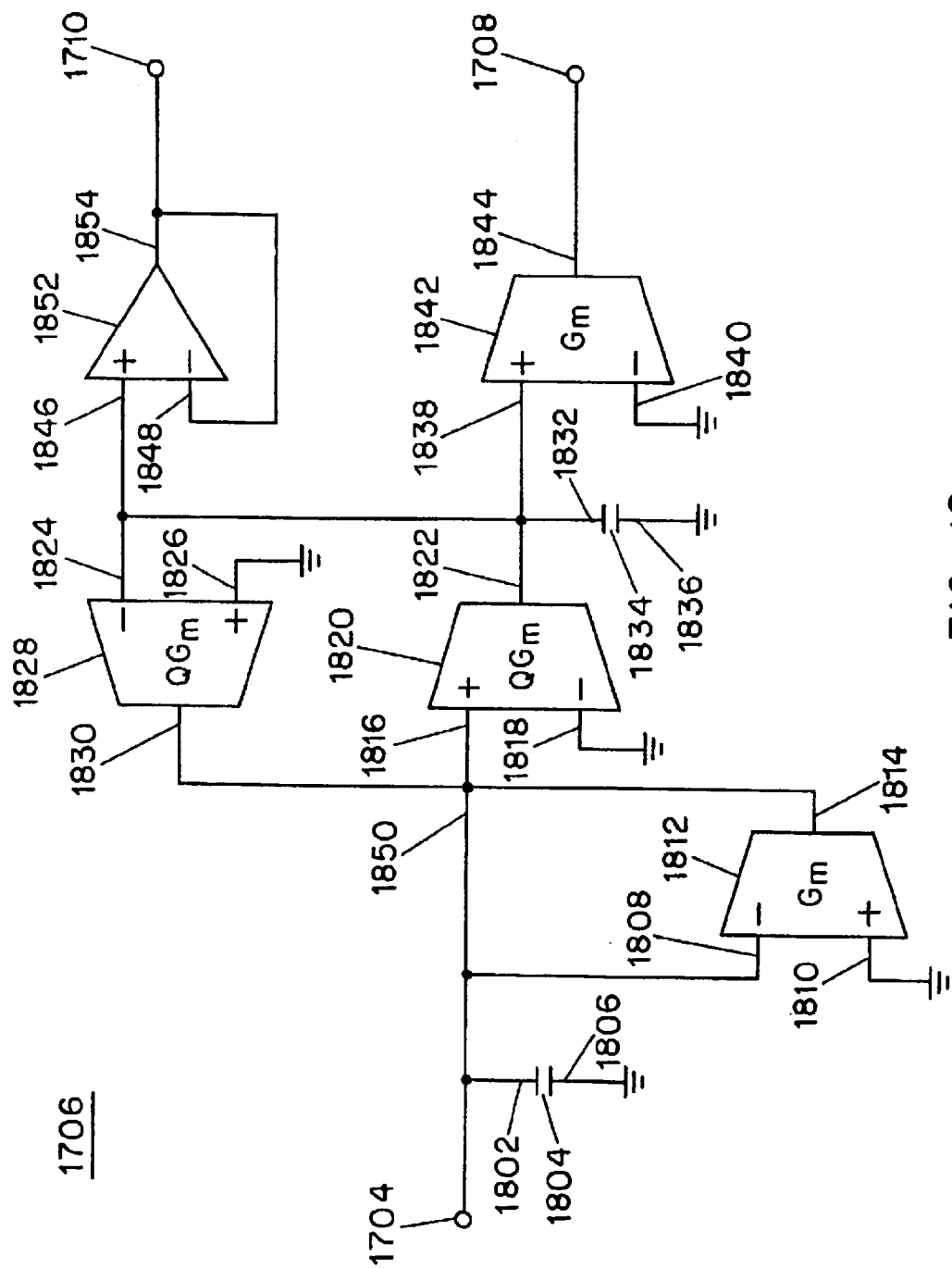
FIG. 18 is a circuit diagram illustrating a multi-output main filter in accordance with the present invention.

FIG. 18 illustrates an exemplary embodiment of the multi-output main filter 1706 which is in the form of a slightly altered standard Tow-Thomas biquad. The multi-output main filter 1706 differs from the main filter 132 in that the multi-output main filter 1706 includes an additional output 1710. The output 1710 follows the voltage that is presented at a node 1851 of the multi-output main filter 1706. The node 1851 provides an output signal that has undergone input amplification but no output amplification. The multi-output main filter 1706 includes an input 1704, a transconductor 1812, a transconductor 1820, a transconductor 1828, a transconductor 1842, an operational amplifier 1852, a capacitor 1804, a capacitor 1834, an output 1708, and an output 1710. The center frequency coo of the multi-output main filter 1706 can be calculated by the equation:

$$\omega_0 = Q\, G_m / C \qquad (2)$$

where Q is the quality factor of the multi-output main filter 1706 and $G_m$ is the transconductance of transconductor 1812. The absolute value of the transconductances and capacitances can be scaled by the same factor, i.e., impedance scaling, without affecting the transfer function of the multi-output main filter 1706, since the transfer function depends on the ratios of these values. Impedance scaling does not change the transfer function of the multi-output main filter 1706; however, it does change the power dissipation and the noise level of the multi-output main filter 1706.

A signal received by the input 1704 of the multi-output main filter 1706 is applied to a terminal 1802 of the capacitor 1804, a negative input 1808 of the transconductor 1812, an output 1814 of the transconductor 1812, a positive input 1816 of the transconductor 1820, and an output 1830 of the transconductor 1828. These connections form a node 1850. The other terminal 1806 of the capacitor 1804 is connected to ground. The capacitor 1804 integrates the current signals provided to node 1850 by the outputs of transconductors.

The transconductor 1812 operates on the difference between the voltage signal received at its positive input 1810, which is connected to ground, and the voltage signal received at its negative input 1808, and provides a current signal at its output 1814. The signal at the current output 1814 of the transconductor 1812 is equal to the difference between the voltage signal received by its positive input 1810, which is connected to ground, and the signal received by its negative input 1808, which is the voltage at terminal 1802 of the capacitor 1804, scaled by its transconductance $G_m$. As explained above, the output 1814 of the transconductor 1812 together with one terminal 1802 of the capacitor 1804, the negative input 1808 of the transconductor 1812, the input 1704, the positive input 1816 of the transconductor 1820 and the output 1830 of the transconductor 1828 form node 1850. The transconductor 1812 forms a feedback loop with the node 1850.

The transconductor 1820 operates on the difference between the voltage signal received at its positive input 1816, which is the voltage at terminal 1802 of the capacitor 1804, and the voltage signal received at its negative input 1818, which is connected to ground, and provides a current signal at its output 1822. The current signal at the output 1822 is equal to the difference between the voltage signal received by the positive input 1816, which is connected to node 1850, and the voltage signal received by the negative input 1818, scaled by a transconductance $QG_m$. The common connection of the output 1822 of the transconductor 1820 together with one terminal 1832 of a capacitor 1834, a positive input 1838 of the transconductor 1842, a negative input 1824 of the transconductor 1828, and a positive input 1846 of the operational amplifier 1852 form node 1851. The other terminal 1836 of the capacitor 1834 is connected to ground. The capacitor 1834 integrates the current provided to node 1851 by the output 1822 of transconductor 1820.

The transconductor 1828 operates on the difference between the voltage signal received at its positive input 1826, which is connected to ground, and the voltage signal received at its negative input 1824, which is voltage at terminal 1832 of the capacitor 1834, and provides a signal at its output 1830, which is connected to node 1850. The current signal at the output 1830, which is connected to node 1850, is equal to the difference in the signal received by the positive input 1826 and the signal received by the negative input 1824, which is connected to node 1851, of the transconductor 1828, scaled by a transconductance $QG_m$.

The transconductor 1842 operates on the difference between the signal received at its positive input 1838, which is the voltage at terminal 1832 of the capacitor 1834, and the voltage signal received at its negative input 1840, which is connected to ground, and provides a current signal at an output 1844. The signal at the output 1844 is equal to the difference between the voltage signal received by the positive input 1838, which is connected to node 1851, and the signal received by the negative input 1840 of the transconductor 1842, scaled by a transconductance $G_m$. The output 1844 of the transconductor 1842 is coupled to the output 1708 of the multi-output main filter 1706.

The operational amplifier acts as a buffer between the node 1851 and the output 1710. The voltage at the output 1710 will follow the voltage at the terminal 1832 of the capacitor 1834. An output 1854 of the operational amplifier 1852 is connected to a inverting input 1848 of the operational amplifier 1852 and the output 1710.

In an exemplary embodiment of the multi-output main filter 1706, the capacitance of the capacitors 1804 and 1834 are each 80 pf. the quality factor, Q, is 20, and the transconductance $G_m$ is 50.

In another exemplary embodiment of the multi-output main filter 1706, a first diode (not shown) and a second diode (not shown) are connected to the node 1850. The cathode of the first diode is connected to the node 1850 and an anode of the first diode is connected to ground. The anode of the second diode is connected to the node 1850 and a cathode of the second diode is connected to ground. This arrangement limits the voltage swing at the node 1850 to approximately ±0.7 volts.

In still another exemplary embodiment of the multi-output main filter 1706, a first diode (not shown) and a second diode (not shown) are connected to the input 1704. The cathode of the first diode is connected to the input 1704 and an anode of the first diode is connected to ground. The anode of the second diode is connected to the input 1704 and a cathode of the second diode is connected to ground. This arrangement limits the voltage swing at the input 1704 to approximately ±0.7 volts.

In yet another exemplary embodiment of the multi-output main filter 1706, a first diode (not shown) and a second diode (not shown) are connected to the output 1708. The cathode of the first diode is connected to the output 1708 and an anode of the first diode is connected to ground. The anode of the second diode is connected to the output 1708 and a cathode of the second diode is connected to ground. This arrangement limits the voltage swing at the output 1708 to approximately ±0.7 volts.

Figure 19:
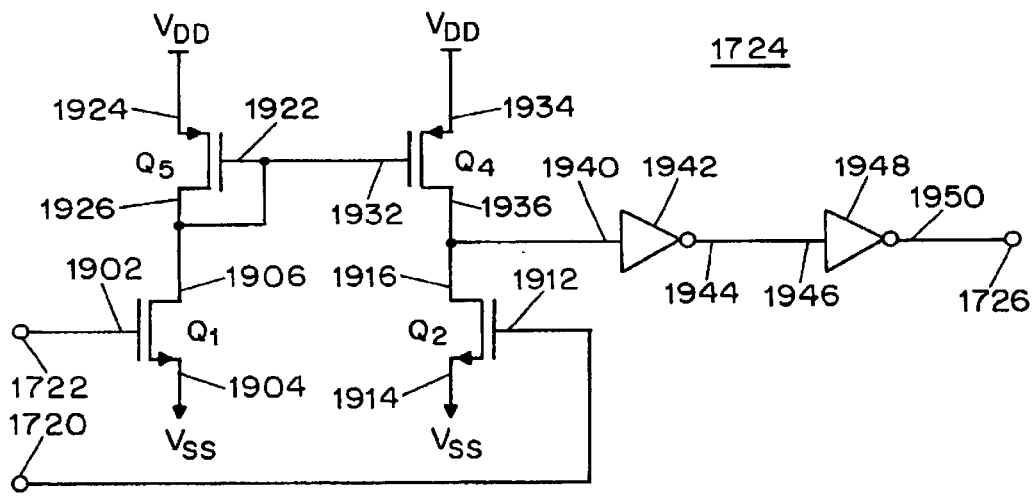
FIG. 19 is a circuit diagram illustrating a comparison circuit in accordance with the present invention.

FIG. 19 illustrates an exemplary embodiment of the comparison circuit 1724 shown in FIG. 17 in greater detail. The comparison circuit 1724 determines whether the voltage signal received at its input 1720, which is representative of the voltage envelope of the signal received at the input 1704 of the multi-output main filter 1706 as determined by the first peak detector 904, is more than 10 dB greater than the voltage signal received at its input 1722. The voltage signal at input 1722 is representative of the voltage envelope of the signal produced at the output 1710 of the multi-output main filter 1706 as determined by the second peak detector 904. The comparison circuit 1724 includes an NMOS transistor $Q_1$, an NMOS transistor $Q_2$, a PMOS transistor $Q_3$, a PMOS transistor $Q_4$, an inverter 1942, and an inverter 1948. A signal received by the input 1722 of the comparison circuit 1724 is applied to the gate 1902 of the NMOS transistor $Q_1$; and a signal received by the input 1720 of the comparison circuit 1724 is applied to the gate 1912 of the NMOS transistor $Q_2$.

The PMOS transistor $Q_3$ and the PMOS transistor $Q_4$ form a current mirror. The source 1924 of the PMOS transistor $Q_3$, and the source 1934 of the PMOS transistor $Q_4$ are both connected to supply voltage $V_{dd}$. The gate 1922 of the PMOS transistor $Q_3$ is connected to the gate 1932 of the PMOS transistor $Q_4$, the drain 1926 of the PMOS transistor $Q_3$, and the drain 1906 of the NMOS transistor $Q_1$. The drain 1936 of the PMOS transistor $Q_4$ is connected to the drain 1916 of the NMOS transistor $Q_2$ and an input 1940 of the inverter 1942. And the source 1904 of the NMOS transistor $Q_1$ and the source 1914 of the NMOS transistor $Q_2$ is connected to supply voltage $V_{ss}$.

The voltage of the signal received at the input 1722, which is representative of the voltage envelope of the signal produced at the output 1710 of the multi-output main filter 1706, as determined by the second peak detector 904, causes a current to flow through the NMOS transistor $Q_1$. Likewise, the voltage of the signal received at the input 1720, which is representative of the voltage envelope of the signal received at the input 1704 of the multi-output main filter 1706, as determined by the first peak detector 904, will cause a current to flow through the NMOS transistor $Q_2$. The PMOS transistor $Q_4$ is dimensioned such that the width to length ratio of the transistor is 3 times that of the PMOS transistor $Q_3$. Therefore, the current mirror will create a current flowing from the source 1934 to the drain 1936 of the PMOS transistor $Q_4$ that is 10 dB greater than the current flowing through the NMOS transistor $Q_1$. If the current flowing through the PMOS transistor $Q_4$ is greater than the current flowing through the NMOS transistor $Q_2$, the voltage envelope of the signal received at the input 1704 of the multi-output main filter 1706 is not more than 10 dB larger than the voltage of the signal produced at the output 1710 of the multi-output main filter 1706. Therefore, charge will collect at the input 1940 of the inverter 1942, and an output 1944 of the inverter 1942 will be driven to a logical zero voltage level. If the current flowing through the PMOS transistor $Q_4$ is less than the current flowing through the NMOS transistor $Q_2$, the voltage envelope of the signal received at the input 1704 of the multi-output main filter 1706 is more than 10 dB larger than the voltage of the signal produced at the output 1710 of the multi-output main filter 1706. Therefore, transistor $Q_2$ will sink charge from the input 1940 of the inverter 1942, and the output 1944 of the inverter 1942 will be driven to a logical one voltage level.

The output 1944 of the inverter 1942 is connected to an input 1946 of the inverter 1948. An output 1950 of the inverter 1948 is connected to the output 1726. The inverters 1942 and 1948 serve to "clean up" (i.e. make the logical zero to logical one voltage level signal transitions and the logical one to logical zero voltage level signal transitions more abrupt) the signal produced by the drain 1936 of the PMOS transistor $Q_4$.

Figure 20:
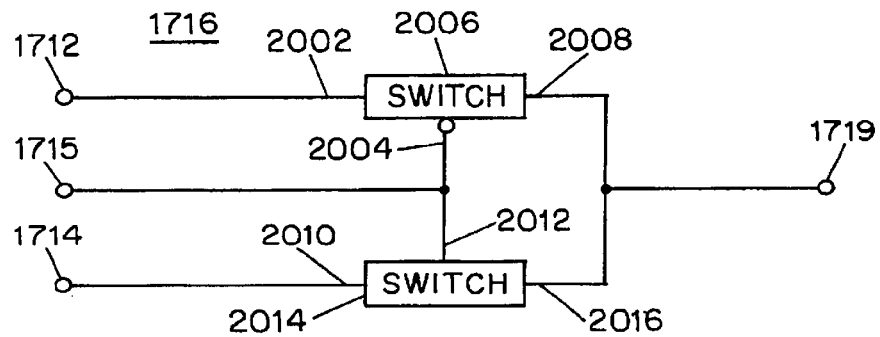
FIG. 20 is a circuit diagram illustrating a switching unit in accordance with the present invention.

FIG. 20 illustrates an exemplary embodiment of the switching unit 1716 as shown in FIG. 17. The switching unit 1716 includes an input 1712, an input 1714, an input 1715, a first switch 2006, a second switch 2014 and an output 1719. The switching unit 1716 provides one of the signals received at the inputs 1712, 1714 to the output 1719 in response to a signal received at the input 1715. If the signal received at the input 1715 is a logical one voltage level (i.e., 5 V), switch 2014 closes while switch 2006 opens, and the signal received at the input 1714 is provided to the output 1719. A logical one voltage level signal received at the input 1715 is representative of the voltage envelope of the signal received at the input 1704 of the multi-output main filter 1706, as determined by the first peak detector 904, being not more than 10 dB greater than the voltage signal received at its input 1722. The voltage signal received at the input 1722 is representative of the voltage envelope of the signal produced at the output 1710 of the multi-output main filter 1706, as determined by the second peak detector 904 and as compared by the comparison circuit 1724. If the signal received at the input 1715 is a logical zero voltage level, switch 2014 opens while switch 2006 closes, and the signal received at the input 1712 is provided to the output 1719. A logical zero voltage level signal received at the input 1715 is representative of the voltage envelope of the signal received at the input 1704 of the multi-output main filter 1706, as determined by the first peak detector 904, being more than 10 dB greater than the voltage signal received at its input 1722. The voltage signed received at the input 1722 is representative of the voltage envelope of the signal produced at the output 1710 of the multi-output main filter 1706 as determined by the second peak detector 904 and as compared by the comparison circuit 1724. Switches 2006 and 2014 may each be implemented as CMOS transmission gates.

A signal received at the input 1712 is applied to one terminal 2002 of the first switch 2006; a signal received at the input 1714 is applied to one terminal 2010 of the second switch 2014; and a signal received at the input 1715 is applied to the switch control terminal 2012 of the second switch 2014 and the inverting switch control terminal 2004 of the first switch 2006. The first switch 2006 closes to connect its terminal 2002 to its other terminal 2008 if the signal received at the inverting switch control terminal 2004 is a logical zero voltage level (i.e., ground potential). If the signal at the inverting switch control terminal 2004 is a logical one voltage level (i.e., 5 V), the first switch 2006 opens to disconnect its terminal 2002 from its other terminal 2008 resulting in an open circuit between those terminals. The other terminal 2008 of the first switch 2006 is connected to the output 1719 of the switching unit 1716.

The second switch 2014 closes to connect its terminal 2010 to its other terminal 2016 if the signal received at the switch control terminal 2012 is a logical one voltage level. If the signal at the switch control terminal 2012 is a logical zero voltage level, the second switch 2014 opens to disconnect its terminal 2010 from its other terminal 2016 resulting in an open circuit between those terminals. The other terminal 2016 of the second switch 2014 is connected to the output 1719 of the switching unit 1716.

It should be appreciated that in an alternate embodiment, the main filter output gain unit 138 may be implemented in the digital domain, by using an analog to digital converter to create a digital representation of the analog signal and a multiplier and multiplying a digitized representation of the signal received at the input 136 by a digitized representation of one of the amplification factors.

What is claimed is:

1. An active filter system comprising:
   a system input for receiving a system input signal;
   a system output for providing a system output signal;
   a first input gain circuit having a signal input coupled to the system input for receiving the system input signal, a gain control input and an output for providing a first amplified system input signal, the first input gain circuit being responsive to a first gain control signal received by the gain control input for amplifying the system input signal by a first amplification factor to obtain the first amplified system input signal, and being responsive to a second gain control signal received by the gain control input for amplifying the system input signal by a second amplification factor to obtain the first amplified system input signal;
   a first filter circuit having an input coupled to the output of the first input gain circuit, and an output, the first filter circuit being responsive to the first amplified system input signal received at its input for providing a first processed signal at its output;
   a first output gain circuit having a signal input coupled to the output of the first filter circuit for receiving the first processed signal, a gain control input and an output for providing a first amplified processed signal, the first output gain circuit being responsive to the first gain control signal received by its gain control input for amplifying the first processed signal received at its signal input by a third amplification factor to obtain the first amplified processed signal and responsive to a second gain control signal received by its gain control input for amplifying the first processed output signal received at its signal input by a fourth amplification factor to obtain the first amplified processed signal;
   a second input gain circuit having a signal input coupled to the system input for receiving the system input signal, a gain control input, an output control input, and an output for providing a second amplified system input signal, the second input gain circuit being responsive to the first gain control signal received by its gain control input for amplifying the system input signal by the first amplification factor to obtain the second amplified system input signal and being responsive to the second gain control signal received by its gain control input for amplifying the system input signal by the second amplification factor to obtain the second amplified system input signal, and the second input gain circuit being responsive to a first output control signal received by its output control input for providing the second amplified system input signal to its output and responsive to a second output control signal for causing its output to be an open circuit;
   a second filter circuit having an input coupled to the output of the second input gain circuit, and an output, the second signal processing circuit being responsive to the second amplified system input signal received by its input for providing a second processed signal at its output;
   a second output gain circuit having a signal input coupled to the output of the second filter circuit for receiving the second processed signal, a gain control input, a polarity control input, an output control input, and an output for providing one of an auxiliary output signal and ground, the second output gain circuit being responsive to a third gain control signal received by its gain control input for amplifying the second processed signal by a fifth amplification factor to obtain an amplified second processed signal, and being responsive to a fourth gain control signal received by its gain control input for amplifying the second processed signal by a sixth amplification factor to obtain the amplified second processed signal, the second output gain circuit being responsive to a first polarity gain control signal received by its polarity control input for inverting the amplified second processed signal to obtain the auxiliary output signal, and being responsive to a second polarity gain control signal received by its polarity control input for amplifying the amplified second processed signal by a unity gain to obtain the auxiliary output signal, the second output gain circuit being responsive to a first output control signal received by its output control input for connecting its output to ground, and being responsive to a second output control signal received by its output control input for providing the auxiliary output signal at its output;
   a signal adding circuit having a first input coupled to the output of the first output gain circuit, a second input coupled to the output of the second output gain circuit, and an output coupled to the system output, the signal adding circuit combining the first amplified processed signal provided by the output of the first output gain circuit, and one of the auxiliary output signal and ground provided by the output of the second output gain circuit to provide the system output signal at the output of the signal adding circuit.

2. The active filter system of claim 1 further comprising:
a signal strength detector having an input coupled to the input of the first filter circuit and an output, the signal strength detector being responsive to a signal strength of the first amplified system input signal at the input of the first filter circuit being equal to or greater than a first threshold for providing a first signal strength signal at the output of the signal strength detector, and being responsive to a signal strength of the first amplified system input signal at the input of the first filter circuit being less than a second threshold for providing a second signal strength signal at the output of the signal strength detetor;

and a gain control circuit having an input coupled to the output of the strength detector, and a multiplicity of outputs respectively coupled to the gain control input of the first input gain circuit, to the gain control input of the first output gain circuit, to the gain control input and the output control input of the second input gain circuit, and to the gain control input, the polarity control input and the output control input of the second output gain circuit, the gain control circuit being responsive to the first signal strength signal received at its input for providing the second gain control signal to the gain control input of the first input gain circuit, the second gain control signal to the gain control input of the first output gain circuit, the second gain control signal to the gain control input of the second input gain circuit, the second output control signal to the output control input of the second input gain circuit, the third gain control signal to the gain control input of the second output gain circuit, the first polarity gain control signal to the polarity control input of the second output gain circuit, the second output control signal to the output control input of the second output gain circuit, and, after a predetermined delay, for providing the first output control signal to the output control input of the second input gain circuit and the first output control signal to the output control input of the second output gain circuit, the gain control circuit being responsive to the second signal strength signal received by its input for providing the first gain control signal to the gain control input of the first input gain circuit, the first gain control signal to the gain control input of the first output gains circuit, the first gain control signal to the gain control input of the second input gain circuit, the second output control signal to the output control input of the second input gain circuit, the third gain control signal to the gain control input of the second output gain circuit, the second polarity gain control signal to the output control input of the second output gain circuit and, after a predetermined delay, for providing the first output control signal to the output control input of the second input gain circuit and the first output control signal to the output control input of the second output gain circuit.

3. The active filter system of claim 1, wherein the first filter circuit and the second filter circuit are each a Tow-Thomas biquad having an input terminal, an output terminal, first, second, third and fourth transconductors each having a normal input, an inverting input and an output, a first capacitor, and a second capacitor, the first transconductor having a first transconductance and having its inverting input and output connected to the input terminal and its normal input connected to ground, the second transconductor having a second transconductance equal to the product of the first transconductance and a quality factor of the Tow-Thomas biquad and having its inverting input connected to ground, its normal input connected to the input terminal and its output connected to a first node, the third transconductor having the second transconductance and having its inverting input connected to the first node, its normal input connected to ground and its output connected to the input terminal, the fourth transconductor having the first transconductance and having its normal input connected to the first node, its inverting input connected to ground and its output connected to the output terminal, the first capacitor being connected between the input terminal and the ground, and the second capacitor being connected between the first node and ground.

4. The active filter system of claim 2, wherein the signal strength detector comprises:
a peak detector having an input coupled to the input of the first filter circuit and an output, the peak detector being responsive to the first amplified system input signal received by the input of the first filter circuit for providing a voltage envelope peak of the first amplified system input signal at the output of the peak detector;
a threshold detector having an input coupled to the output of the peak detector, and an output, the threshold detector comparing the voltage envelope peak of the first amplified system input signal received at its input with the first threshold and providing the first signal strength signal at its output if the voltage envelope peak of the first amplified system input signal is equal to or greater than the first threshold, the threshold detector providing the second signal strength signal at its output if the voltage envelope peak of first amplified system input signal is less than the second threshold.

5. The signal processing system of claim 2, wherein the gain control circuit includes a multiple state logic circuit responsive to the first signal strength signal and the second signal strength signal for deriving respective signals provided by the multiplicity of outputs of the gain control circuit.

6. The signal processing system of claim 1, wherein the first input gain circuit and the second input gain circuit each include circuitry for clamping their respective output signals so as to prevent saturation of the first filter circuit and the second filter circuit.

7. The signal processing system of claim 2, wherein the first threshold is a voltage envelope signal strength level of the first amplified system input signal that causes the first filter circuit to approach saturation, and the second threshold is a voltage envelope signal strength level of the first amplified system input signal that causes the first filter circuit to provide a signal at its output having a minimum tolerable signal-to-noise ratio.

8. An active filter system comprising:
a system input for receiving a system input signal;
a system output for providing a system output signal;
a first input gain circuit having a signal input coupled to the system input for receiving the system input signal, a gain control input and an output for providing a first amplified system input signal, the first input gain circuit being responsive to a first gain control signal received by the gain control input for amplifying the system input signal by a first amplification factor to obtain the first amplified system input signal and responsive to a second gain control signal received by the gain control input for amplifying the system input signal by a second amplification factor to obtain the first amplified system input signal;

a first filter circuit having an input coupled to the output of the first input gain circuit and an output, the first filter circuit being responsive to a first amplified system input signal received at its input for providing a first processed signal at its output;

a second input gain circuit having a signal input coupled to the system input for receiving the system input signal, a gain control input, an output control input and an output for providing a second amplified system input signal, the second input gain circuit being responsive to the first gain control signal received by its gain control input for amplifying the system input signal by the first amplification factor to obtain the second amplified system input signal and responsive to the second gain control signal received by its gain control input for amplifying the system input signal by the second amplification factor to obtain the second amplified system input signal, the second input gain circuit being responsive to a first output control signal received by its output control input for providing the second amplified system input signal to its output and responsive to a second output control signal for causing its output to be an open circuit;

a second filter circuit having a signal input coupled to the output of the second input gain circuit, a gain control input and an output for providing a second amplified processed signal, the second filter circuit being responsive to the second amplified system input signal received by its input for providing a second processed signal, and being responsive to a third gain control signal received by its gain control input for amplifying the second processed signal by a fifth amplification factor to obtain the second amplified processed signal and being responsive to a fourth gain control signal received by its gain control input for amplifying the second processed signal by a sixth amplification factor to obtain the second amplified processed signal;

a signal adding circuit having a first input coupled to the output of the first filter circuit, a second input coupled to the output of the second filter circuit and an output for providing a combined processed signal, the signal adding circuit combining the first processed output signal provided by the output of the first filter circuit and the second amplified processed signal provided by the output of the second filter circuit to provide the combined processed signal;

a first output gain circuit having a signal input coupled to the output of the signal adding circuit, a gain control input and an output coupled to the system output, the first output gain circuit being responsive to the first gain control signal received by its gain control input for amplifying the combined processed signal received at its signal input by the third amplification factor to obtain the system output signal at its output and being responsive to the second gain control signal received by its gain control input for amplifying the combined processed signal received at its signal input by the fourth amplification factor to obtain the system output signal at its output.

9. The system of claim 8 further comprising:

a signal strength detector circuit having an input coupled to the output of the first active filter circuit and an output, the signal strength detector circuit being responsive to a signal strength of the first amplified system input signal at the input of the first filter circuit being equal to or greater than a first threshold for providing a first signal strength signal at its output, the signal strength circuit being responsive to a signal strength of the first amplified system input signal at the input of the first filter circuit being less than a second threshold for providing a second strength signal at its output;

a gain control circuit having an input coupled to the output of the strength detector circuit and a plurality of outputs respectively coupled to the gain control input of the first input gain circuit, to the gain control input of the first output gain circuit, to the gain control input and the output control input of the second input gain circuit, and to the gain control input of the second filter circuit, the gain control circuit being responsive to the first signal strength signal received at its input for providing the second gain control signal to the gain control of the first input gain circuit, the second gain control signal to the gain control input of the first output gain circuit, the second gain control signal to the gain control input of the second input gain circuit, the second output control signal to the output control input of the second input gain circuit, the fourth gain control signal to the gain control input of the second filter circuit, and after a predetermined delay for providing the first output control signal to the output control input of the second input gain circuit and the third gain control signal to the gain control input of the second filter circuit, and the gain control circuit being responsive to the second signal strength signal received at its input for providing the first gain control signal to the gain control of the first input gain circuit, the first gain control signal to the gain control input of the first output gain circuit, the first gain control signal to the gain control input of the second input gain circuit, the second output control signal to the output control input of the second input gain circuit, the fourth gain control signal to the gain control input of the second filter circuit, and after a predetermined delay for providing the first output control signal to the output control input of the second input gain circuit and the third gain control signal to the gain control input of the second filter circuit.

10. The filter system of claim 9, wherein the second filter circuit has an input terminal, a first gain control terminal, a second gain control terminal and an output terminal, first, second, third, fourth and fifth transconductors each having a normal input, an inverting input and an output, a first capacitor, a second capacitor, a first and third switch, each having a first signal terminal, a second signal terminal and a switch control terminal, and a second and fourth switch having a first signal terminal, a second signal terminal, and an inverting switch control terminal, the first transconductor having a first transconductance and having its inverting input and output connected to the input terminal and its normal input connected to ground, the second transconductor having a second transconductance equal to the product of the first transconductance and a quality factor of the active filter and having its inverting input connected to ground, its normal input connected to the input terminal and its output terminal connected to a first node, the third transconductor having the second transconductance and having its inverting input connected to the first node, its normal input connected to ground and its output connected to the input terminal, the first capacitor being connected between the input terminal and the ground, the second capacitor being connected between the first node and ground, the fourth transconductor having a third transconductance equal to nine-tenths of the first transconductance and having its normal input connected to ground, its inverting input connected to the first node and its output connected to the first signal terminal of the first switch and the first signal terminal of the second switch, the second signal terminal of the first switch being connected to the output terminal, the switch control terminal of the first switch being connected to the first gain control terminal, the second signal terminal of the second switch being connected to ground, the switch control terminal of the second switch being connected to the first gain control terminal, the second terminal of the first switch connected to the output terminal, the active filter circuit being responsive to a logical one voltage level signal at the first gain control terminal providing the signal received at the first signal terminal of the first switch to the second signal terminal of the first switch, and being responsive to a logical zero voltage level signal at the first gain control terminal providing the signal received at the first signal terminal of the second switch to the second signal terminal of the second switch, the fifth transconductor having a fifth transconductance equal to nine times the first transconductance and having its normal input connected to the first node, its inverting input connected to ground and its output connected to the first signal terminal of the third switch and the first signal terminal of the fourth switch, the second signal terminal of the third switch being connected to the output terminal, the switch control terminal of the third switch being connected to the second gain control terminal, the second signal terminal of the fourth switch being connected to ground, the switch control terminal of the fourth switch being connected to the second gain control terminal, the second terminal of the third switch connected to the output terminal, the active filter circuit responsive to a logical one voltage level signal at the second gain control terminal providing the signal received at the first signal terminal of the third switch to the second signal terminal of the third switch, and responsive to a logical zero voltage level signal at the gain control terminal of the third switch providing the signal received at the first signal terminal of the fourth switch to the second signal terminal of the fourth switch.

11. A filter system comprising:
   a system input for receiving a system input signal;
   a system output for providing a system output signal;
   a first input gain circuit having a signal input coupled to the system input for receiving the system input signal, a gain control input and an output for providing a first amplified system input signal, the first input gain circuit being responsive to a first gain control signal received by the gain control input for amplifying the system input signal by a first amplification factor to obtain the first amplified system input signal and responsive to a second gain control signal received by the gain control input for amplifying the system input signal by a second amplification factor to obtain the first amplified system input signal;
   a first filter circuit having an input coupled to the output of the first input gain circuit, a first output for providing a first processed signal, and a second output for providing a buffered first processed signal, the first filter circuit being responsive to a first amplified system input signal received at its input for providing the first processed signal at its first output, and for providing the buffered first processed signal at its second output;
   a second input gain circuit having a signal input coupled to the system input for receiving the system input signal, a gain control input, an output control input and an output for producing a second amplified system input signal, the second input gain circuit being responsive to the first gain control signal received by its gain control input for amplifying the system input signal by the first amplification factor to obtain the second amplified system input signal and being responsive to the second gain control signal received by its gain control input for amplifying the system input signal by the second amplification factor to obtain the second amplified system input signal, and the second input gain circuit being responsive to a first output control signal received by its output control input for providing the second amplified system input signal to its output and being responsive to a second output control signal received by its output control input for causing its output to be an open circuit;
   a second filter circuit having a signal input coupled to the output of the second input gain circuit, a gain control input and an output for providing a second amplified processed signal, the second filter circuit being responsive to the second amplified system input signal received by its input for providing a second processed signal, and being responsive to a third gain control signal received by its gain control input for amplifying the second processed signal by a third amplification factor to obtain the second amplified processed output signal and being responsive to a fourth gain control signal received by its gain control input for amplifying the second processed signal by a sixth amplification factor to obtain the second amplified processed output signal;
   a signal adding circuit having a first input coupled to the first output of the first filter circuit, a second input coupled to the output of the second filter circuit and an output for providing a combined processed signal, the signal adding circuit combining the first processed output signal provided by the output of the first filter circuit and the second amplified processed signal provided by the output of the second filter circuit to provide the combined processed signal;
   a first output gain circuit having a signal input coupled to the output of the signal adding circuit, a gain control input and an output for providing an amplified combined processed signal, the first output gain circuit being responsive to the first gain control signal received by its gain control input for amplifying the combined processed signal received at its signal input by a fifth amplification factor to obtain the amplified combined processed signal and being responsive to the second gain control signal received by its gain control input for amplifying the combined processed signal received at its signal input by a sixth amplification factor to obtain the amplified combined processed signal;
   and a signal switching circuit having a first signal input coupled to the output of the first output gain circuit, a second signal input coupled to the second output of the first filter circuit, a switch control input and an output coupled to the system output, the signal switching circuit being responsive to receiving a first switching signal at the switch control input for providing the amplified combined processed signal received at the first signal input to the output, and being responsive to receiving a second switching signal at the switch control input for providing the buffered first processed output signal received at the second signal input to the output.

12. The system of claim 11 further comprising:

a first peak detector circuit having an input coupled to the output of the input gain of the first active filter and an output, the first peak detector being responsive to the first amplified system input signal for providing a voltage envelope peak of the first amplified system input signal at its output;

a first threshold detector circuit having an input coupled to the output of the first peak detector and an output, the first threshold detector for comparing the voltage envelope peak of the first amplified system input signal received at its input with a first threshold, and providing the first signal strength signal at its output if the voltage envelope peak of the first amplified system input signal is equal to or greater than the first threshold;

a second threshold detector circuit having an input coupled to the output of the first peak detector and an output, the second threshold detector for comparing the voltage envelope peak of the first amplified system input signal received at its input with a second threshold, and providing the second signal strength signal at its output if the voltage envelope peak of the first amplified system input signal is less than the first threshold;

a gain control circuit having first and second inputs coupled to the outputs of first and second threshold detector circuits, respectively, and a multiplicity of outputs respectively coupled to the gain control input of the first input gain circuit, to the gain control input of the first output gain circuit, to the gain control input and the output control input of the second input gain circuit, and to the gain control input of the second filter circuit, the gain control circuit being responsive to the first signal strength signal received at its first input for providing the second gain control signal to the gain control of the first input gain circuit, the second gain control signal to the gain control input of the first output gain circuit, the second gain control signal to the gain control input of the second input gain circuit, the second output control signal to the output control input of the second input gain circuit, the fourth gain control signal to the gain control input of the second filter circuit, and, after a predetermined delay, for providing the first output control signal to the output control input of the second input gain circuit and the third gain control signal to the gain control input of the second filter circuit, and the gain control circuit being responsive to the second signal strength signal received at its second input for providing the first gain control signal to the gain control of the first input gain circuit, the first gain control signal to the gain control input of the first output gain circuit, the first gain control signal to the gain control input of the second input gain circuit, the second output control signal to the output control input of the second input gain circuit, the fourth gain control signal to the gain control input of the second filter circuit, and after a predetermined delay for providing the first output control signal to the output control input of the second input gain circuit and the third gain control signal to the gain control input of the second filter circuit;

a second peak detector circuit having an input coupled to the output of the first active filter circuit and an output, the second peak detector being responsive to the first processed signal for providing a voltage envelope peak of the first processed signal at its output;

a comparison circuit having a first signal input coupled to the output of the first peak detector, a second signal input coupled to the output of the second peak detector, and an output, the comparison circuit being responsive to the voltage envelope peak of the first amplified system input signal and the voltage envelope peak of the first processed signal for providing a first switching signal to its output if the voltage envelope peak of the first amplified system input signal is greater than the voltage envelope peak of the first processed signal by a specified threshold, and for providing a second switching signal to its output if the voltage envelope peak of the first amplified system input signal is not greater than the voltage envelope peak of the first processed output signal by the specified threshold.

13. The filter system of claim 12, wherein the first filter circuit is a multi-output Tow-Thomas biquad having an input terminal, a first output terminal, a second output terminal, first, second, third and fourth transconductors each having a normal input, an inverting input and an output, an operational amplifier having a normal input, an inverting input and an output, a first capacitor, and a second capacitor, the first transconductor having a first transconductance and having its inverting input and output connected to the input terminal and its normal input connected to ground, the second transconductor having a second transconductance equal to the product of the first transconductance and a quality factor of the multi-output Tow-Thomas biquad and having its inverting input connected to ground, its normal input connected to the input terminal and its output terminal connected to a first node, the third transconductor having the second transconductance and having its inverting input connected to the first node, its normal input connected to ground and its output connected to the input terminal, the fourth transconductor having the first transconductance and having its normal input connected to the first node, its inverting input connected to ground and its output connected to the first output terminal, the operational amplifier having its normal input connected to the first node and its inverting input and its output connected to the second output terminal, the first capacitor being connected between the input terminal and the ground, and the second capacitor being connected between the first node and ground.

* * * * *